United States Patent

Wada

[11] Patent Number: 5,982,680
[45] Date of Patent: Nov. 9, 1999

[54] SEMICONDUCTOR MEMORY

[75] Inventor: Masaharu Wada, Yokohama, Japan

[73] Assignee: Kabushiki Kaisha Toshiba, Kawasaki, Japan

[21] Appl. No.: 09/181,976

[22] Filed: Oct. 29, 1998

[30] Foreign Application Priority Data

Oct. 30, 1997 [JP] Japan .................................. 9-298046

[51] Int. Cl.$^6$ ..................................................... G11C 7/00
[52] U.S. Cl. ..................................... 365/200; 365/230.03
[58] Field of Search .............................. 365/200, 230.03, 365/201, 230.06

[56] References Cited

U.S. PATENT DOCUMENTS 5,475,648  12/1995  Fujiwara .................................. 365/200

OTHER PUBLICATIONS

Fujii, et al. "A Low–Power Sub 100 ns 256K Bit Dynamic RAM," IEEE Journal of Solid–State Circuits, vol. SC–18, No. 5, Oct. 1983, pp. 441–445.

Primary Examiner—Huan Hoang
Assistant Examiner—David Lam
Attorney, Agent, or Firm—Loeb & Loeb, LLP

[57] ABSTRACT

A memory cell array is composed of N ($1 \leq N \leq Nmax$) blocks. A redundancy memory is always composed of Nmax blocks. A block decoder selects one of the N blocks of the memory cell array based on a block address signal. A redundancy memory decoder selects one of the Nmax blocks of the redundancy memory based on a redundancy memory selection address signal. When the number of blocks of the memory cell array and the number of blocks of the redundancy memory are different from each other, the N blocks of the memory cell array are in a one to one correspondence with N blocks of the Nmax blocks of the redundancy memory and the redundancy memory decoder selects one of the N blocks of the redundancy memory. The other blocks than the N blocks of the redundancy memory are left unused.

6 Claims, 30 Drawing Sheets

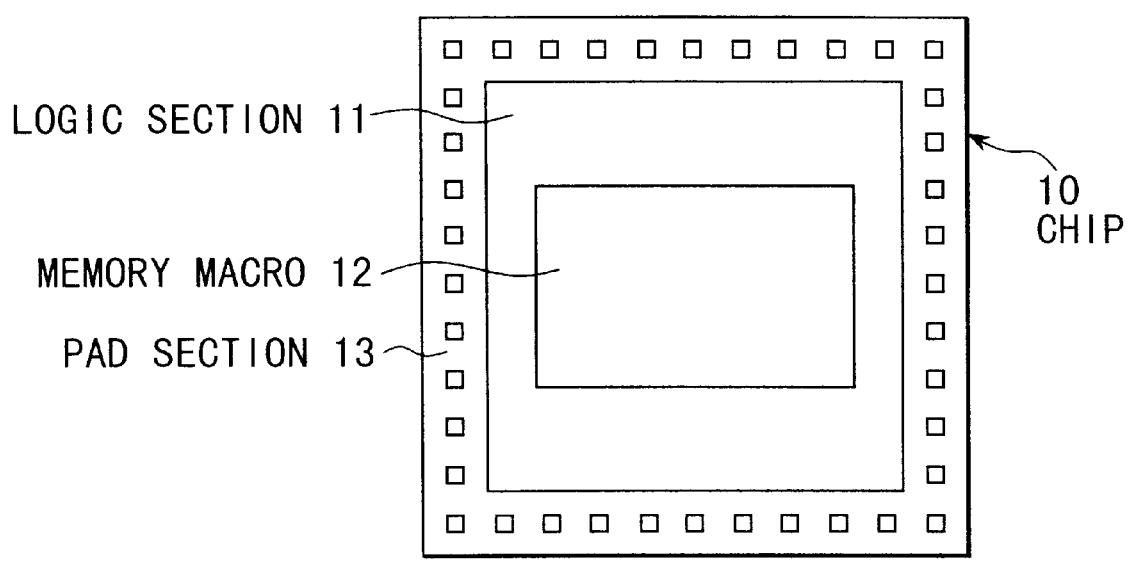
F I G. 22

WHEN CA4, RA11 TO RA9 ARE AT ABOVE VALUES, OUTPUT SIGNAL OF AND CIRCUIT INDICATES "1"

SEMICONDUCTOR MEMORY

BACKGROUND OF THE INVENTION

The present invention relates to a semiconductor memory having a redundancy circuitry and particularly, to a semiconductor memory for which there is applied a designing method to realize a memory capacity (the number of memory bits) which meets a user's desire by increase or decrease in the number of memory segments.

Heretofore, when a memory capacity of a semiconductor memory is changed, there has been a need for a maker to conduct designing of the semiconductor memory from its very start. In recent years, however, there has been arisen a new need for a maker to provide, in a short time period, a semiconductor memory having a memory capacity which meets a user's desire due to product diversification of electronic equipment, increase in complexity of a system and the like. Accordingly, there has been proposed a designing method in which a memory capacity can be changed by increase or decrease in the number of memory segments.

In recent years, attention has also been drawn to the so-called system LSI that a specific system is formed in one chip by integrating a plurality of functions on the one chip. The system LSI is an LSI to gather a plurality of functions, which have respectively been formed in separate chips, on one chip; the system LSI contributes to realization of higher performance, lower power consumption and size reduction (decrease in the number of parts) of a system. In the means time, it is required that there is supplied a semiconductor memory having a memory capacity which meets a user's desire in a short time period in the case of an LSI provided with a function of a semiconductor memory (memory macro) among various system LSIs, for example in the case of a MERGED MEMORY-LOGIC LSI. Hence, for a memory macro in a system LSI as well, there is applied a designing method in which a memory capacity can be changed by increase or decrease in the number of memory segments.

Below described will be a designing method in which a memory capacity can be changed by increase or decrease in the number of memory segments. This designing method employs a circuit block called a memory segment. A memory segment comprises a memory cell array having a specific memory capacity (for example, one megabits), a sense amplifier, a row decoder, a column decoder and the like and is already designed in advance of need. When a semiconductor memory having N megabits, wherein N is a natural number, is designed, N memory segments are used. In this case, each memory segment is not necessary to be redesigned from its start and it is only required that structures of a block decoder and the like are partially changed according to a memory capacity; designing of a semiconductor memory having N megabits can thus be completed in a short time period.

In such a manner, in the above described designing method, since not only can a memory capacity of a semiconductor memory freely be changed by adjusting the number of memory segments but there is no needs for full designing including initial stages for all memory segments, reduction in a turn around time (TAT) and lower cost, as well, can be achieved as compared with a designing method in which designing is performed from its very start for each of all circuits according to a memory capacity of a semiconductor memory.

A semiconductor memory is generally provided with a redundancy circuitry used as substitution in order to improve a production yield, wherein a memory cell having a defect (defective cell) is replaced with a spare memory cell (spare cell).

A redundancy circuitry comprises a redundancy memory (for example, a fuse element) and a redundancy memory decoder, and a redundancy memory is provided, for example, in correspondence to a memory segment. In a memory segment, there is provided a spare cell array and in a redundancy memory, there is stored data for substituting a spare cell for a defective cell in a memory segment corresponding to the redundancy memory and reading out. The redundancy memory decoder has the same structure as a block decoder provided in a memory segment. The block decoder selects a memory segment and a redundancy memory decoder selects a redundancy memory corresponding to the selected memory segment.

In the above described designing method using a memory segment, however, this redundancy circuitry is also designed in advance of need singly or together with another circuit as a block. In this case, if a memory capacity of a semiconductor memory, that is the number of memory segments, is changed, not only is a structure of a block decoder in a memory segment changed but also a structure of a redundancy circuitry (a redundancy memory, a redundancy memory decoder, a switching circuit and the like) is greatly changed. Accordingly, it takes a lot of time for a change in design of the redundancy circuitry, which makes it harder designing in a short time period and with a low cost.

BRIEF SUMMARY OF THE INVENTION

The present invention has been completed giving consideration to the above described situation and it is accordingly an object of the present invention to provide a semiconductor memory for which there is applied a designing method to change a memory capacity (the number of memory bits) by increase or decrease in the number of memory segments, and whose circuit designing can be performed without any great change in structure of the redundancy circuitry even when a memory capacity is changed.

A semiconductor memory of the present invention comprises: a memory cell array composed of N ($1 \leq N \leq N\max$) blocks; a redundancy memory always composed of Nmax blocks; a block decoder for selecting one of the N blocks of the memory cell array based on a block address signal; a redundancy memory decoder for selecting one of the Nmax blocks of the redundancy memory based on a redundancy memory selection address signal including the block address signal; and a switching circuit which performs remedy of a defective cell in a block of the memory cell array selected by the block decoder based on data in a block of the redundancy memory selected by the redundancy memory decoder. When the number of blocks of the memory cell array and the number of blocks of the redundancy memory are different from each other, the N blocks of the memory cell array are in a one to one correspondence with N blocks of the Nmax blocks of the redundancy memory and the redundancy memory decoder selects one of the N blocks of the redundancy memory.

When the number of blocks of the memory cell array and the number of blocks of the redundancy memory are different from each other, the redundancy memory decoder has the same structure as the block decoder.

When the number of blocks of the memory cell array and the number of blocks of the redundancy memory are different from each other, the redundancy memory decoder can select one of the Nmax blocks of the redundancy memory.

When the number Nmax of blocks of the redundancy memory is $2^n$ and the number N of blocks of the memory cell array is ($2^{n-1}$<N<$2^n$), the block address signal and the redundancy memory selection address signal are both of n bits and each of the Nmax blocks of the redundancy memory is assigned with an address in a continuous manner and each of the N blocks of the memory cell array is assigned with an address in a discontinuous manner.

When the number Nmax of blocks of the redundancy memory is $2^n$ and the number N of blocks of the memory cell array is $2^m$ (m<n), the block address signal is of m bits and the redundancy memory selection address signal is of n bits, and each of the Nmax blocks of the redundancy memory and each of the N blocks of the memory cell array are both assigned with an address in a continuous manner.

Each block of the redundancy memory is constructed with a part in which there is stored data which indicates whether a defective cell is present and a part in which there is stored data which is used for replacement of the defective cell by a spare cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 22 is a representation of an example of a floor plan of MERGED MEMORY-LOGIC LSI;

DETAILED DESCRIPTION OF THE INVENTION

Below described will be a semiconductor memory of the present invention in detail in reference to the accompanying drawings.

Figure 1:
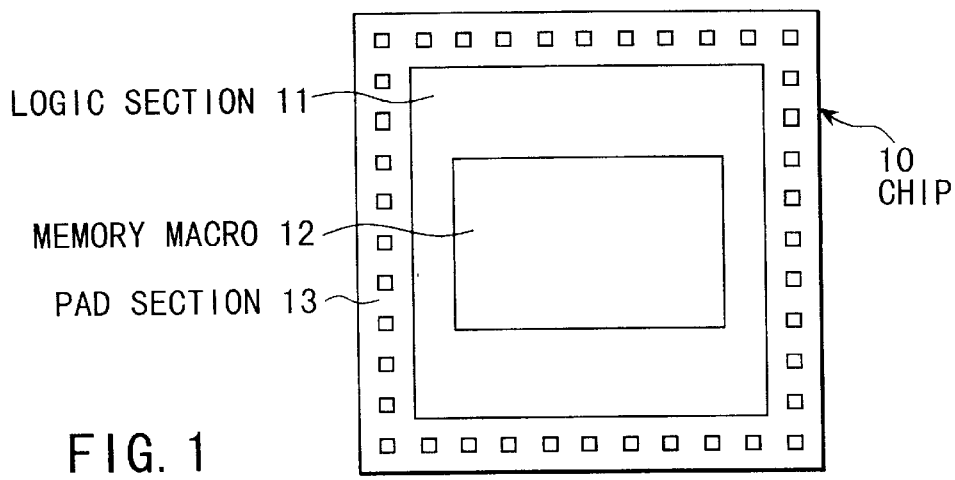
FIG. 1 is a representation of an example of a floor plan of MERGED MEMORY-LOGIC LSI.

FIG. 1 shows an example of a floor plan of a MERGED-DRAM LOGIC LSI for which the present invention is applied.

In a semiconductor chip 10, there is configured a logic section 11, a memory macro 12 and a PAD section 13. In the logic section 11, a circuit block having a function other than a semiconductor memory is formed. The memory macro 12 has a function of a DRAM (dynamic random access memory) and in the memory macro 12, a series of completion type operations of writing data, reading data and the like can be performed. The PAD section 13 is disposed along the periphery of the semiconductor chip 10 and provided with pads for input of a control signal and input/output of data.

A feature of such a MERGED DRAM-LOGIC LSI is that data exchange between the logic section 11 and the memory macro 12 is directly performed. That is, while when a logic circuit and a memory circuit are separately formed in different chips, data exchange has to be performed via an I/O pad or a long interconnect (bus), there is no need for such an I/O pad and a long interconnect in the case of the MERGED DRAM-LOGIC LSI. Accordingly, in the MERGED DRAM-LOGIC LSI, a large-sized I/O buffer is not required, which can contribute to lower power consumption. Beside, data which the memory macro can input or output at the same time (the number of I/O) can be drastically increased, which can also contribute to higher performance of a memory.

Figure 2:
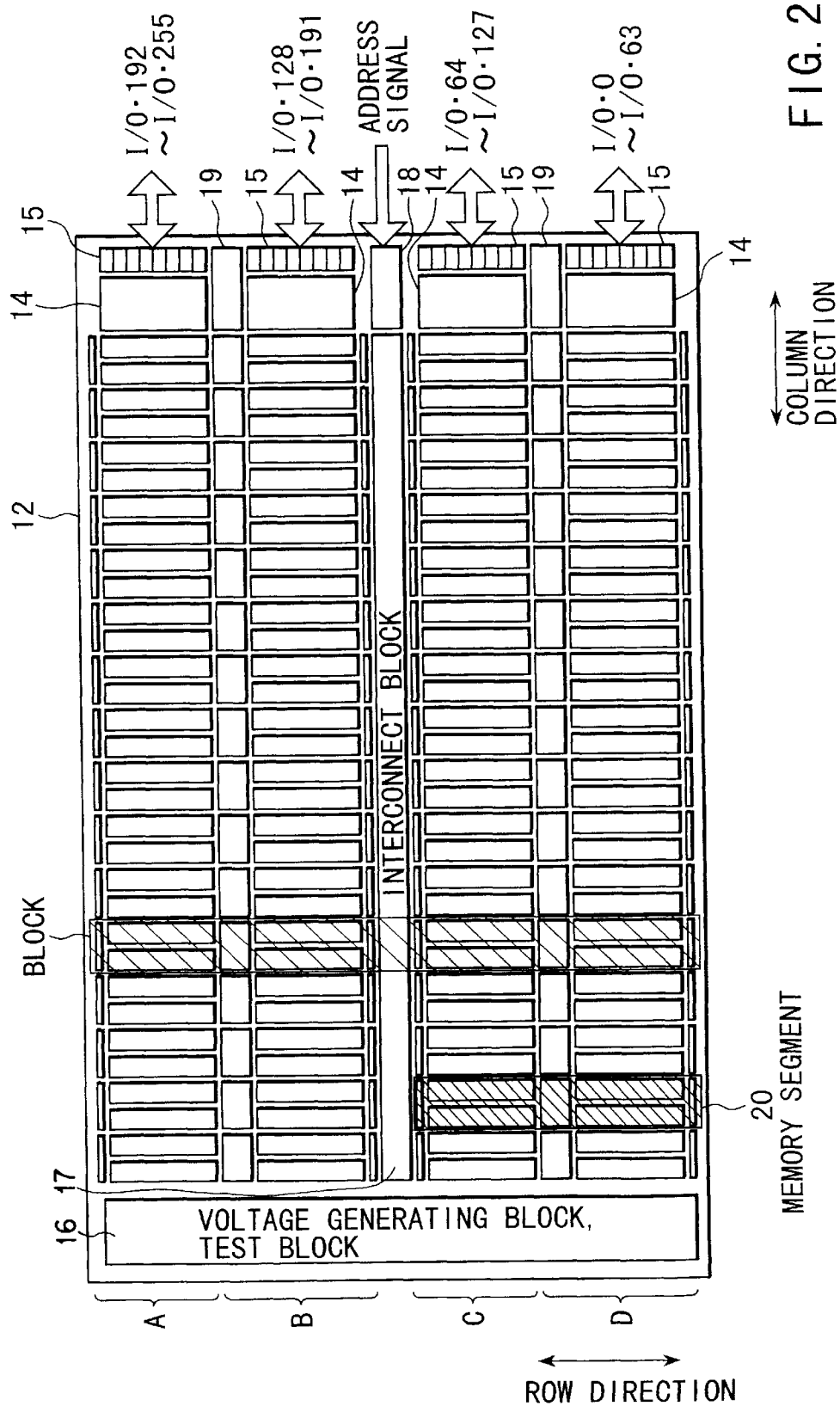
FIG. 2 is a representation of a floor plan in a memory macro.

FIG. 2 shows an example of a floor plan of the memory macro of FIG. 1.

At one end of a memory cell 12 in a column direction, a voltage generating block and a test block 16 are disposed. In the voltage generating block, there are formed circuits to generate voltages of a substrate voltage, a word line voltage and a bit line voltage and in the test block, there is formed a circuit to perform a test of a memory cell. At the other end of the memory macro 12 in a column direction, input/output data blocks 14 and input/output register blocks 15 are disposed. In an input/output data block 14, there is formed a redundancy circuitry whereby spare cells substitute for a DQ buffer and a defective cell connecting to a dataline (DQ line). In an input/output register block 15, there is formed an input/output register. The input/output register block 15 constitutes an interface between the memory macro and the logic section. In the memory macro 12 of this example, input/output of 256 bit data I/O-0 to I/O-255 can be performed at the same time.

In the middle portion of the memory macro 12, an interconnect block 17 extends long along a column direction. In the interconnect block 17, a source line, a control signal line and the like are formed. At the other end of the memory macro 12 in a column direction a control block 18 is disposed abutting on the interconnect block 17. In the control block 18, there is formed input circuits for inputting an address signal, a control signal (clock signal), a command signal and the like. Control blocks 19 are respectively inserted between input/output data blocks 14. A control block 19 not only receives an address signal from a control block 18 but supplies the address signal to a row decoder or a column decoder.

On both sides of the interconnect block 17, two group of 16 memory segments 20 are respectively disposed in a continuous manner. In the memory macro 12, accordingly, a total of 32 memory segments 20 are disposed. Each memory segment 20 comprises, for example, a memory cell array having a memory capacity of one megabits. In this case, the memory macro has a memory capacity of 32 megabits.

In this example, the number of columns of the memory segments 20 is two (double cell array structure). In this case, the number of the memory segments 20 can be increased or decreased by two, that is a block unit, at a time. Therefore, the minimal number of the memory segments 20 is two and the maximal number is set to $2^n$ (n is a natural number), for example 32 segments. One column of the memory segments 20 can be realized (single cell array structure). In this case, one memory segment 20 can be disposed as the minimal number (the maximal number of the segments is $2^n$).

A redundancy circuitry is designed in advance of need so as to cope with $2^n$ memory segments assuming the case where the maximal number of the memory segments 20 is $2^n$ and such a redundancy circuitry can be used even when designed is a semiconductor memory having the number of the memory segments 20 of less than $2^n$ segments. In this case, a change in the design of the redundancy circuitry can be restricted to a minimum. At this point, detailed description will be given later.

Figures 3A, 3B:
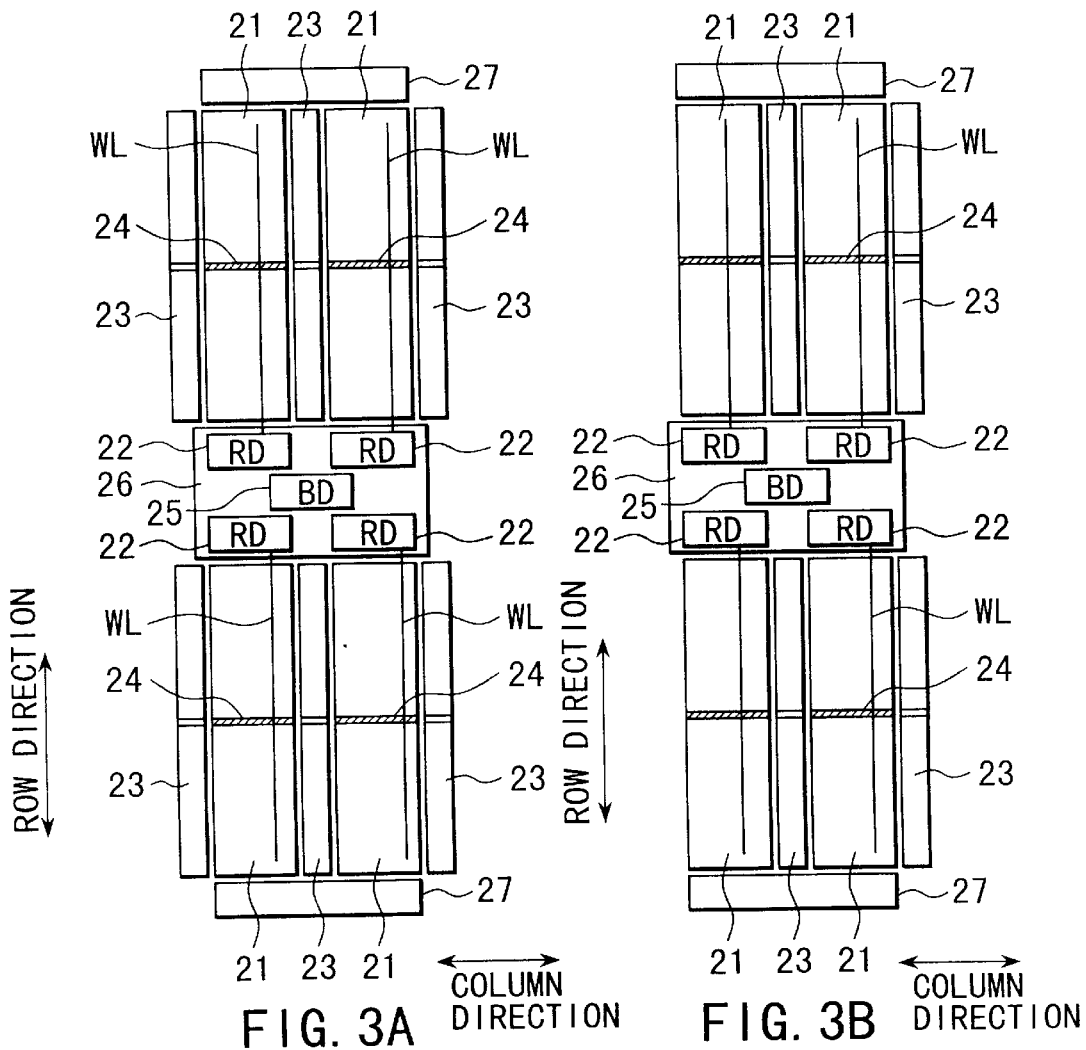
FIGS. 3A and 3B are respective representations of floor plans in memory segments.

FIGS. 3A and 3B are examples of floor plans of the memory segments of FIG. 2.

A memory segment of FIG. 3A corresponds to a memory segment of the memory macro 12 nearest to the voltage generating block and test block 16. A memory segment of FIG. 3B, for example, corresponds to one of all the memory segments in the memory macro 12 of FIG. 2 other than the memory segment thereof nearest to the voltage generating block and test block 16. In this way, two kinds of memory segments are provided and the reason why is that this example employs a shared sense amplifier structure in which a sense amplifier residing on both sides of sub-blocks is functionally shared by the sub-blocks.

Of the two kinds of memory segments, the memory segment of FIG. 3A is selected in use with the higher priority. That is, when the number of memory segments in the memory macro 12 of FIG. 2 is set to the minimal two, the memory segment of FIG. 3A is used and when the number of memory segments in the memory macro 12 of FIG. 2 is set to four or more, the memory segments of FIGS. 3A and 3B are used.

As shown in FIGS. 3A and 3B, a memory segment has four sub-blocks 21. Each sub-block 21 is constructed with a memory cell array having a memory capacity of 256 kilobits and therefore, one memory segment has a memory capacity of one megabits. On each sub-block 21, disposed are 256 word lines WL and 1024 pairs of bit lines BL, /BL. In each sub-block 21, for example, disposed is a spare memory cell array 24 having a memory capacity of four kilobits.

One row decoder 22 is provided for each sub-block 21. Therefore, in one memory segment, disposed is four row decoders 22 having the same structure as each other. Each row decoder 22 decodes a row address signal of 8 bits RA0 to RA7 and one of the 256 word lines WL is selected based on the decoding result.

A block decoder 25 decodes a row address signal (block address signal) of the number of bits corresponding to the number of blocks, for example a row address signal RA9 to RA12 of four bits, and one memory segment is selected based on the decoding result. A row address signal RA8 is used to select one of the two regions which are formed by dividing four sub-blocks in a memory segment with the sense amplifier column switch block 23 as a boundary. The row decoder 22 and the block decoder 25 are disposed in the control block 26.

Power source line blocks 27 are disposed at both ends of a memory segment in a row direction. In a power source line block 27, a power source VCC line, a ground VSS line and the like are disposed.

Figure 4A:
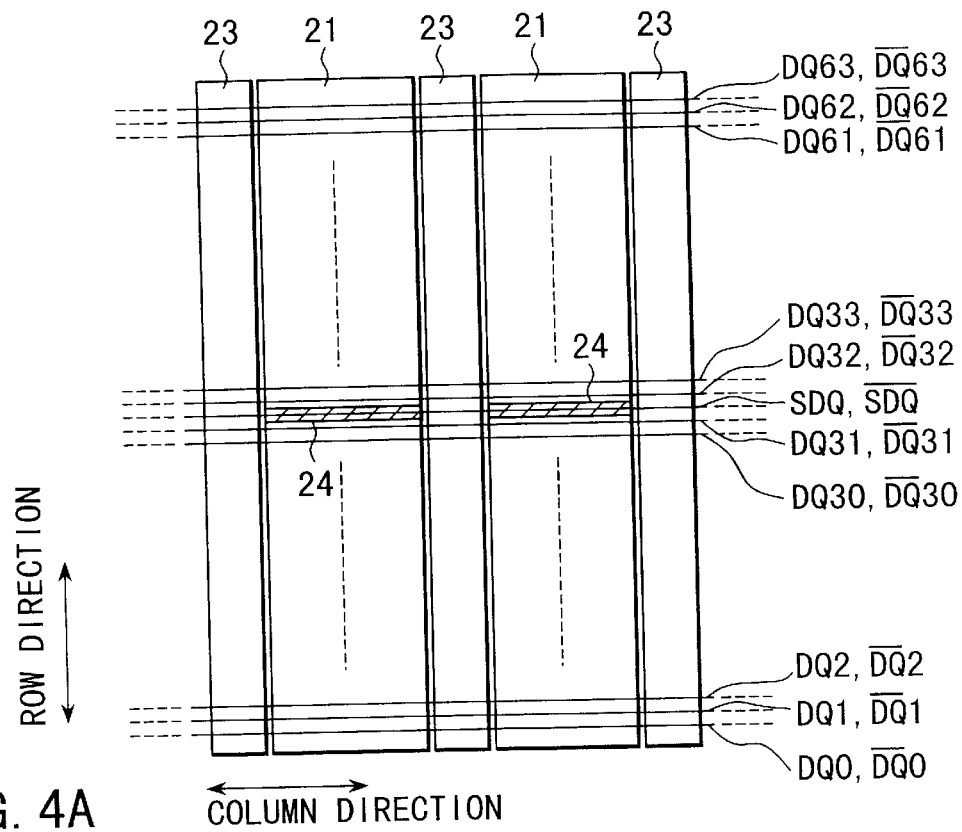
FIGS. 4A and 4B are respective representations showing data line pairs configured on sub-blocks.
Figure 4B:
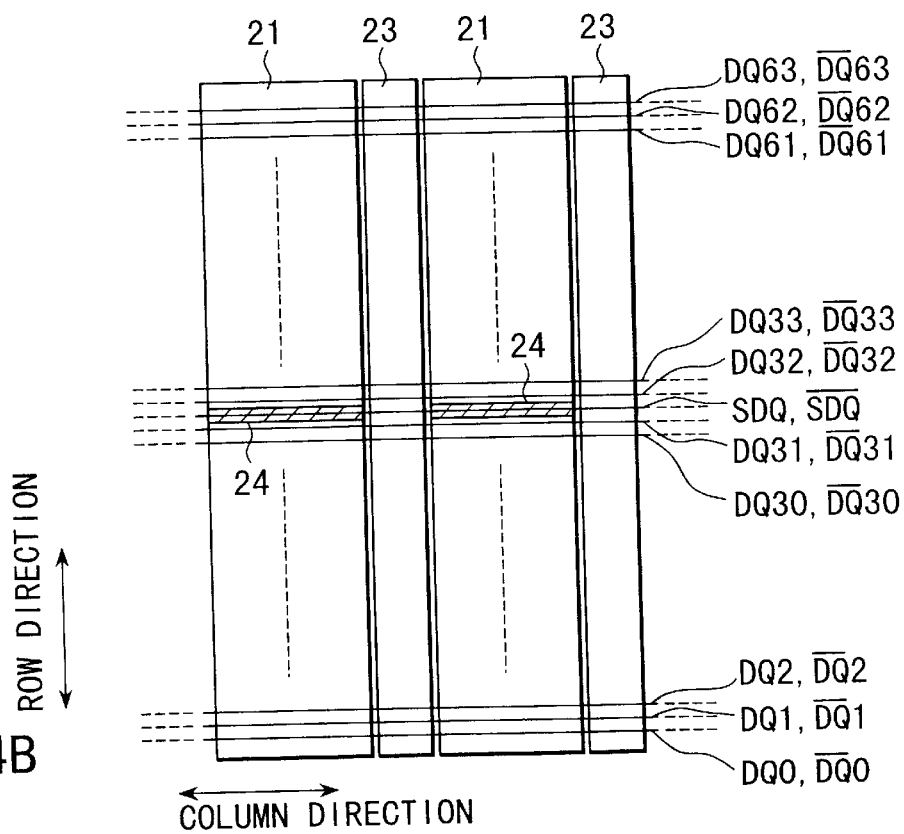

FIG. 4A shows two sub-blocks abutting on each other in a column direction among the four sub-blocks of FIG. 3A. FIG. 4B shows two sub-blocks abutting on each other in a column direction among the four sub-blocks of FIG. 3B.

On the two sub-blocks 21 abutting on each other in a column direction, disposed are 64 data line pairs (DQ line pair) DQ0, /DQ0, . . . DQ63, /DQ63. The 64 data line pairs DQ0, /DQ0, . . . DQ63, /DQ63 are disposed across all the memory segments which are configured continuously in a column direction and are disposed on all the sub-blocks which are configured continuously in a column direction in an abutting manner to one another. As shown in FIG. 2, four sub-blocks are disposed in a row direction and therefore the total number of data line pairs is 256 pairs.

For example, spare data line pairs, for example SDQ, /SDQ, are respectively disposed in spaces between adjacent dataline pairs among 64 dataline pairs DQO, /DQ0, . . . DQ63, /DQ63. When one of 64 data line pairs DQ0, /DQ0, . . . DQ63, /DQ63 is defective, the spare data line pair SDQ, /SDQ is used as an alternative of the one defective data line pair. In such a manner, remedy is performed on each effective data line pair.

Each data line pair DQi, /DQi are connected to 16 bit line pairs in a sub-block 21, for example, via a column switch. Like this, a spare data line pair SDQ, /SDQ are connected to 16 spare bit line pairs in the sub-block 21, for example, via a column switch. Therefore, there are present 1024 bit line pairs and 16 spare bit line pairs in the sub-block 21.

Figure 5A:
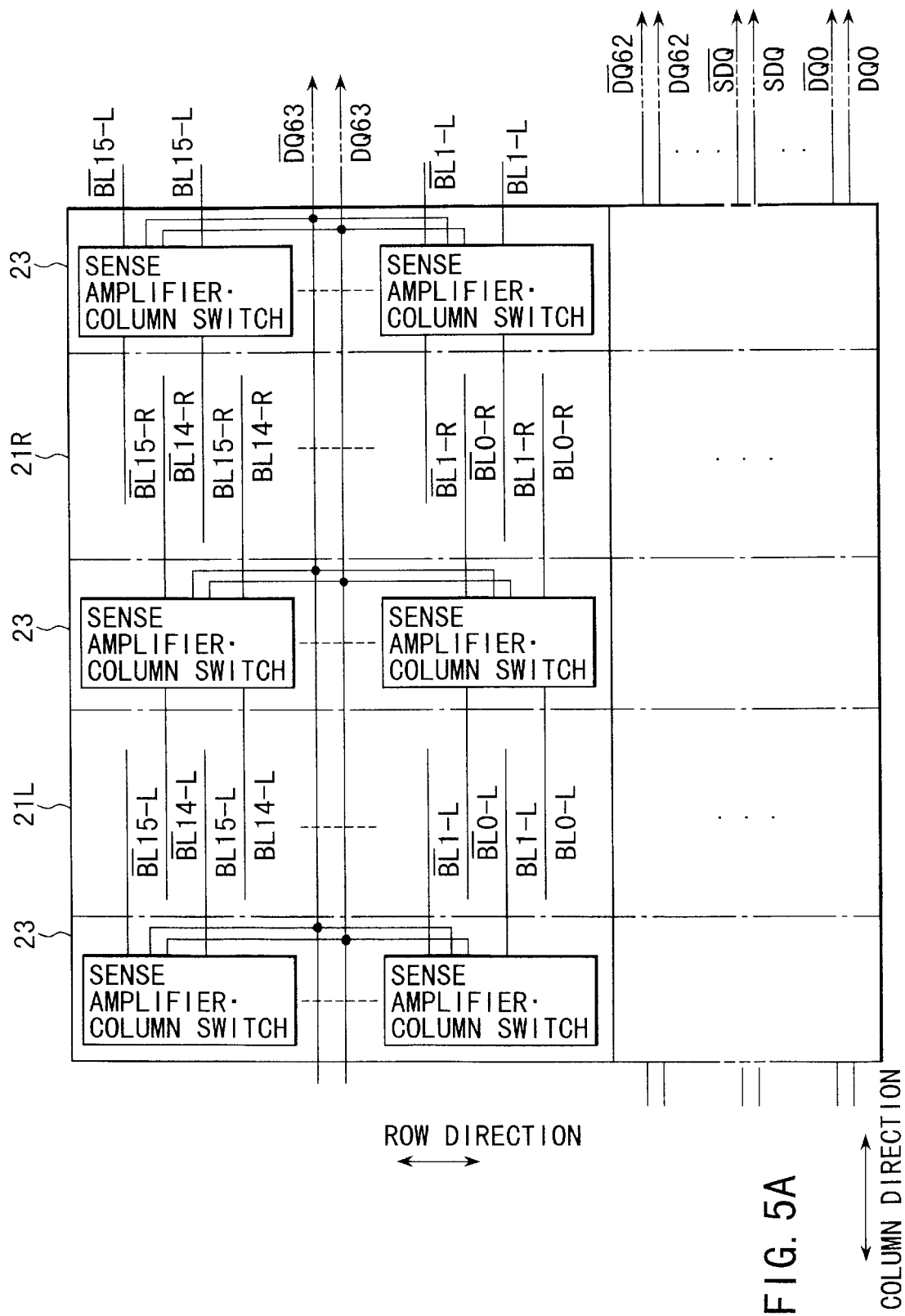
FIGS. 5A and 5B are respective block diagrams showing 16 bit line pairs connected to one data line pair.
Figure 5B:
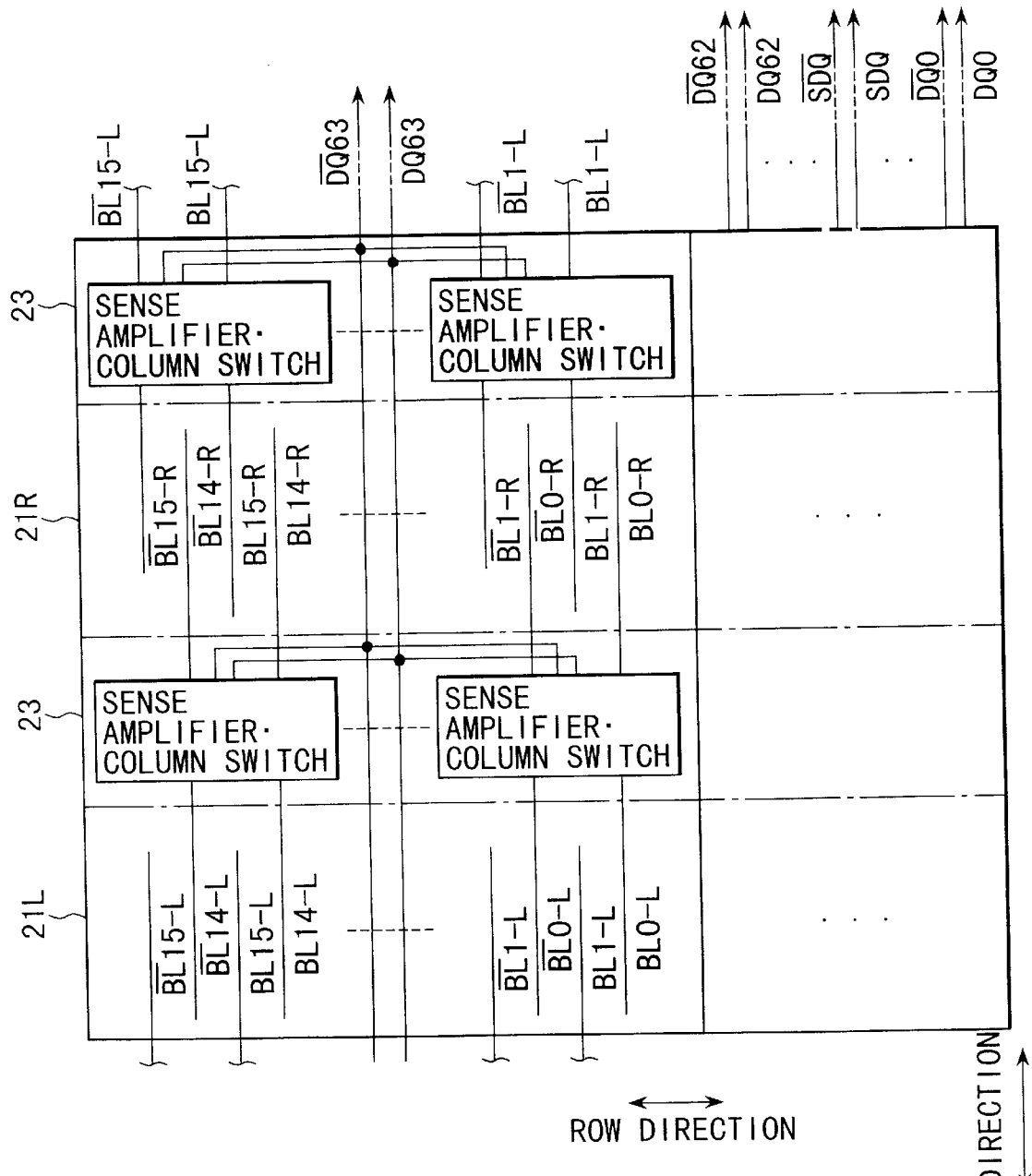

FIG. 5A shows 16 bit line pairs connected to the data line pair DQ63, /DQ63 of FIG. 4A. FIG. 5B shows 16 bit line pairs connected to the data line pair DQ63, /DQ63 of FIG. 4B.

In a sub-block 21L, disposed are 16 bit line pairs BL0-L, /BL0-L, BL1-L, /BL1-L, . . . BL15-L, /BL15-L, which are connected to the data line pair DQ63, /DQ63 via a sense amplifier and a column switch. Bit line pairs BLk-L, /BLk-L (k indicates 0, 2, . . . 14) are connected to a sense amplifier column switch block 23 on one side of the sub-block 21L and bitline pairs BLk-L, /BLk-L (k indicates 1, 3, . . . 15) are connected to a sense amplifier column switch block 23 on the other side of the sub-block 21L.

Like this, in a sub-block 21R, disposed are 16 bit line pairs BL0-R, /BL0-R, BL1-R, /BL1-R, . . . BL15-R, /BL15-R, which are connected to the data line pair DQ63, /DQ63 via a sense amplifier and a column switch. Bitline pairs BLk-R, /BLk-R(k indicates 0, 2, . . . 14) are connected to the sense amplifier column switch block 23 on one side of the sub-block 21R and bitline pairs BLk-R, /BLk-R (k indicates 1, 3, . . . 15) are connected to a sense amplifier column switch block 23 on the other side of the sub-block 21R.

That is, the sense amplifier column switch block 23 is functionally shared by the bit line pairs in the sub-blocks 21L and 21B which are disposed on both sides thereof. In this case, one of the two sub-blocks 21L, 21R being disposed on both sides of the sense amplifier column switch block 23 is selected by a row address signal R8. Bit line pairs in a selected sub-block are connected to a sense amplifier of the sense amplifier column switch block 23.

Figure 6:
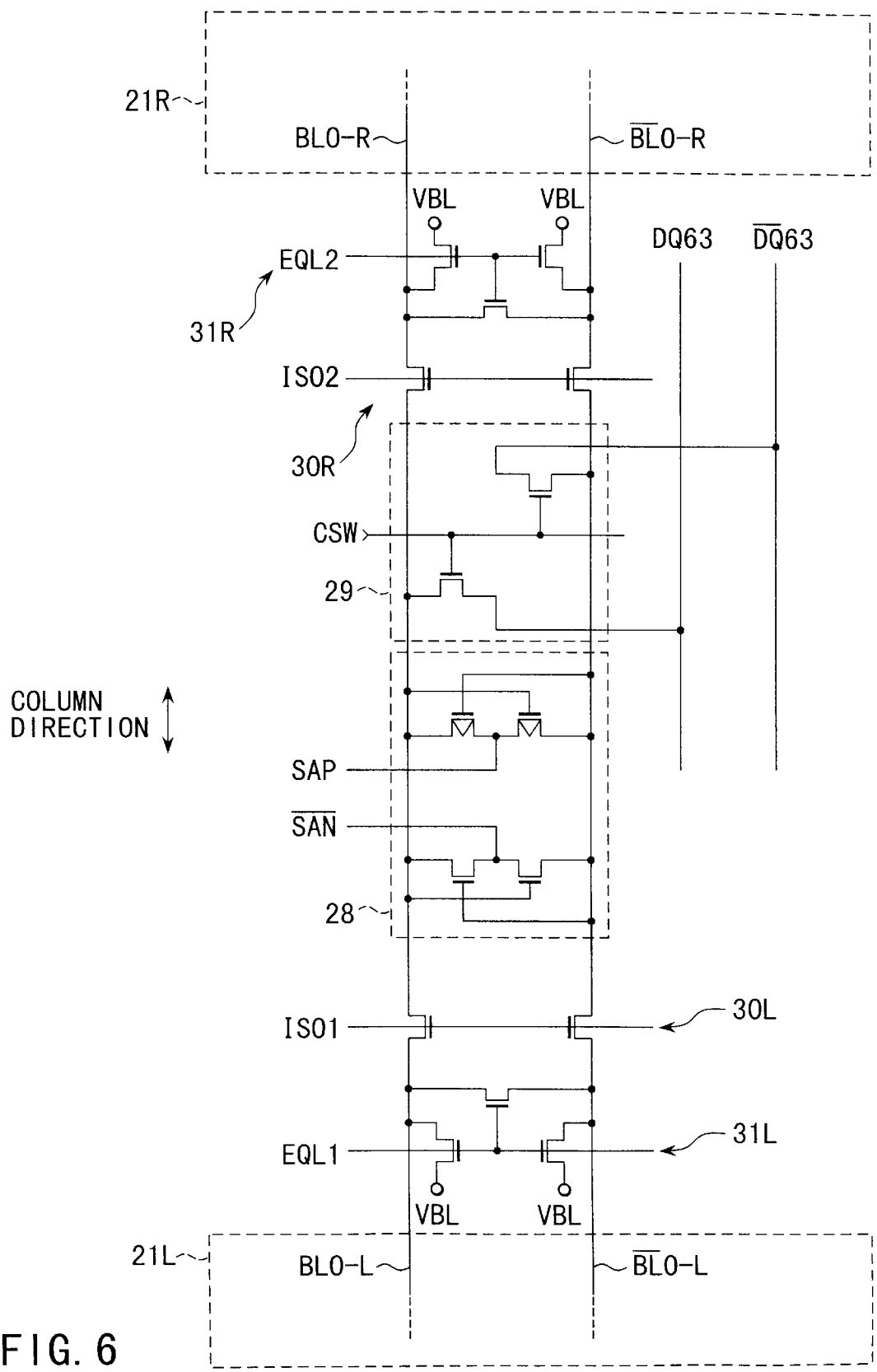
FIG. 6 is a circuit diagram showing two bit line pairs sharing a sense amplifier with each other.

FIG. 6 shows an example of a circuit structure of the sense amplifier column switch block of FIGS. 5A and 5B.

A sense amplifier 28 is connected to a bit line pair BL0-L, /BL0-L in the sub-block 21L via a sub-block selection circuit 30L. The sense amplifier 28 is further connected to a bit line pair BL0-R, /BL0-R in the sub-block 21R via a sub-block selection circuit 30R. The sub-block selection circuits 30L, 30R are controlled by control signals ISO1, ISO2 based on a row address signal RA8. The sense amplifier 28 is controlled by sense amplifier activation signals SAP, /SAN.

The bit line pairs BL0-L, /BL0-L, BL0-R, /BL0-R are connected to the data line pair DQ63, /DQ63 via a column switch 29. The column switch 29 is controlled by a column selection signal CSW. The column selection signal CSW is, for example, a signal based on a result of decoding of a column address signal CA0 to CA3 of four bits.

Equalizer circuits 31L, 30R is circuits to equalize potentials of the bit line pairs BL0-L, /BL0-L, BL0-R, /BL0-R, that is to adjust the potentials to be VBL when in a data read operation. The equalizer circuits 31L, 31R are controlled by equalization control signals EQL1, EQL2.

Figure 7:
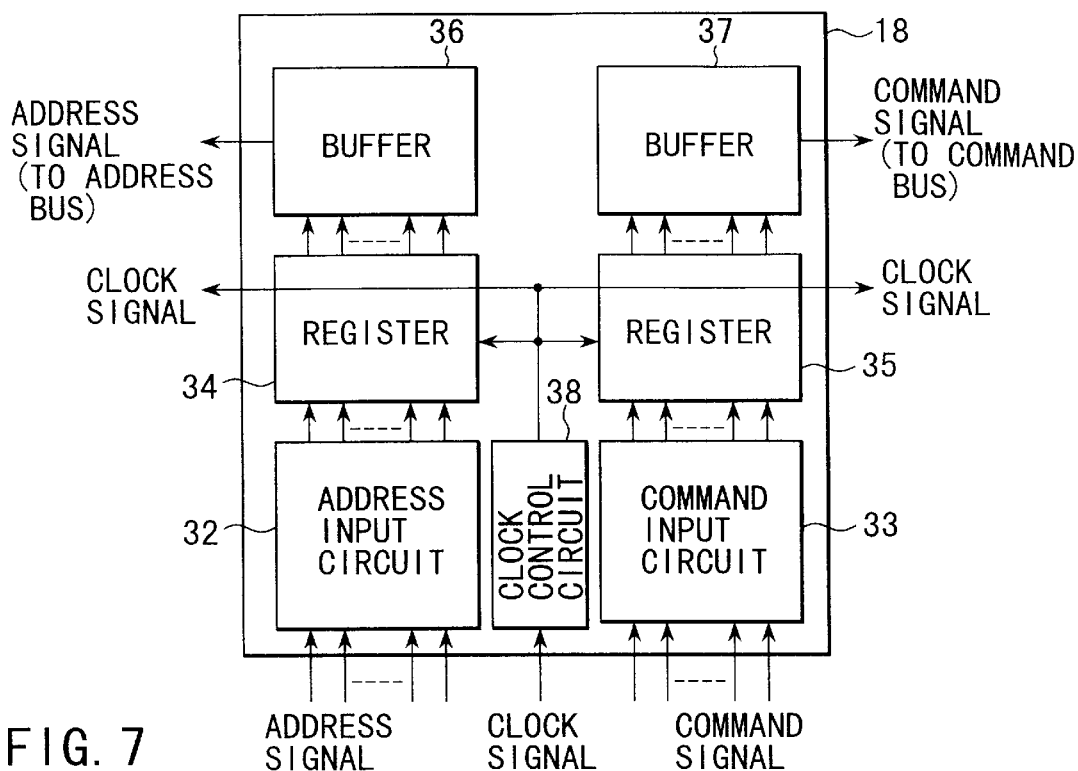
FIG. 7 is a block diagram showing and example of circuits in the control block 18 of FIG. 2.

FIG. 7 shows an example of a structure of the control block 18 of FIG. 2.

An address signal (row or column) is stored in a register 34 by way of an address input circuit 32. A command signal is stored in a register 35 by way of a command input circuit 33. A clock signal is input to a clock control circuit 38. The register 34 outputs an address signal based on a clock signal. An address signal output from the register 34 is guided onto an address bus by way of a buffer 36. The register 35 outputs a command signal based on a clock signal. A command signal output from the register 35 is guided onto a command bus by way of the buffer 37.

Figure 8:
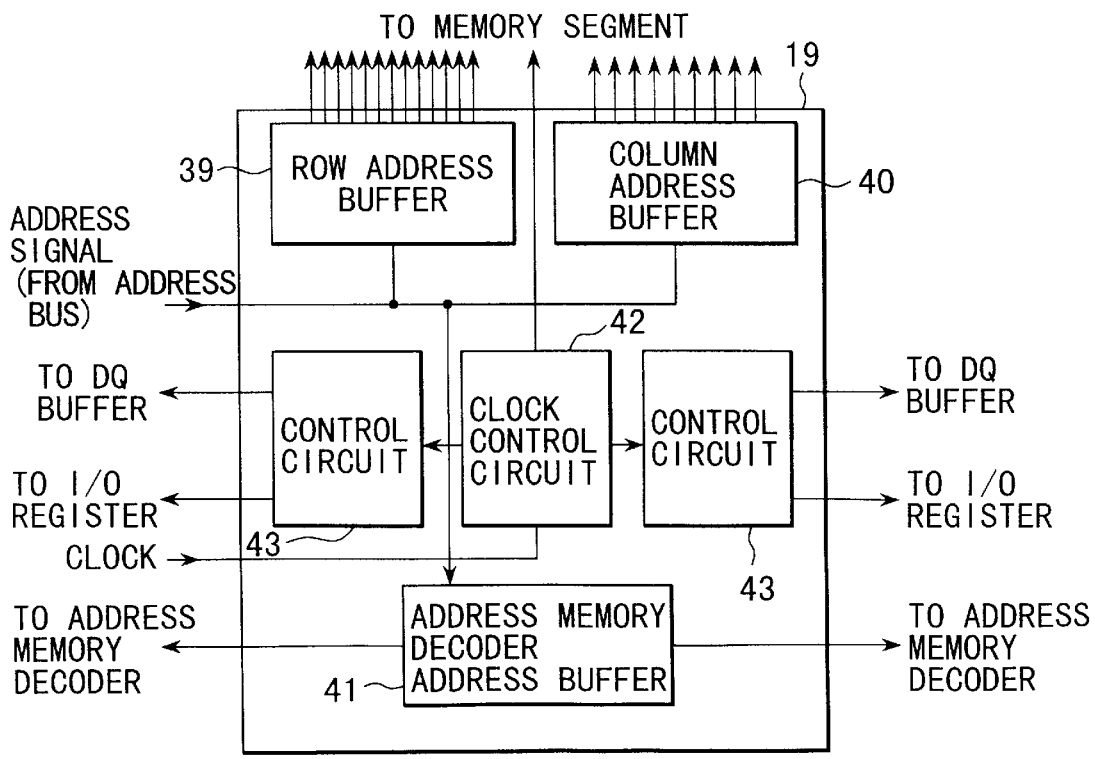
FIG. 8 is a block diagram showing and example of circuits in the control block 19 of FIG. 2.

FIG. 8 shows an example of a structure of the control block 19 of FIG. 2.

A row address signal output from the control block 18 of FIG. 7 is input to a row address buffer 39 through the address bus. A row address signal includes a block address signal to select a block and an address signal to select a sub-block. A row address signal is supplied to a block decoder or a row decoder in a memory segment. A column address signal output from the control block 18 of FIG. 7 is input to a column address buffer 40 through the address bus. A column address signal is supplied to a column decoder (column switch driver CSD) in a memory segment.

For example, a block address signal and an address signal to select a sub-block, which are included in the row address signal, are input to a redundancy memory selection address buffer 41. The block address signal and the address signal to select a sub-block are supplied to a redundancy memory decoder in an input/output data block.

A control circuit 43 controls a circuit in the input/output data block and a circuit in an input/output register block. A clock control circuit 42 supplies clock signals to the control circuit 43 and a memory segment respectively. The clock signal determines timings for receiving data and an address signal.

Figure 9:
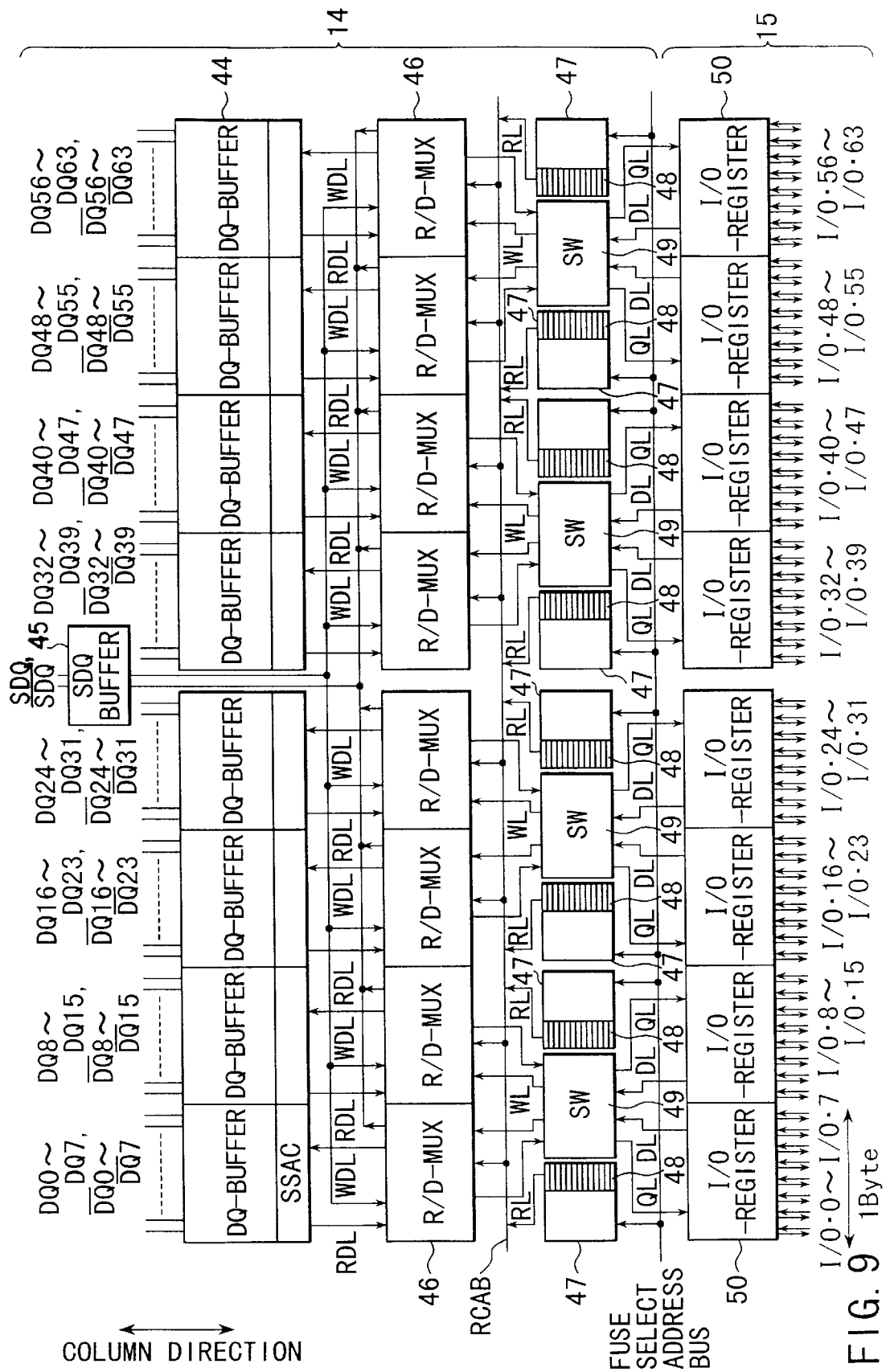
FIG. 9 is a block diagram showing an example of the input/output data block 14 of FIG. 2.

FIG. 9 shows examples of the input/output data block 14 and the input/output register block 15 of FIG. 2.

Sixty four data line pairs DQ0, /DQ0, . . . DQ63, /DQ63 are connected to a data buffer (DQ buffer) 44. A spare data line pair SDQ are connected to a data buffer (SDQ buffer) 45. The data buffers 44, 45 are connected to a redundancy multiplexer 46 via a read data line RDL and a write data line WDL.

The redundancy multiplexer section 46 determines whether or not a data line pair is replaced with a spare data line pair based on a control signal supplied via a redundancy column address bus RCAB from a redundancy memory (for example, fuse) 48. That is, when there is present a defective data line, the defective data line is replaced with a spare data line SDQ, /SDQ by the redundancy multiplexer section 46, since data about the defective data line are stored in the redundancy memory 48.

A redundancy memory decoder 47 is a decoder to select a redundancy memory corresponding to a block (or memory segment) selected by a block address signal.

A redundancy multiplexer section 46 is connected to a switching circuit 49 via a write line WL and a read line RL.

An input/output register 50 is also connected to the switching circuit 49 via a write line DL and a read line QL. In other words, the redundancy multiplexer section 46 and the input/output register 50 are connected to each other with the switching circuit 49 interposing therebetween.

Figure 10:
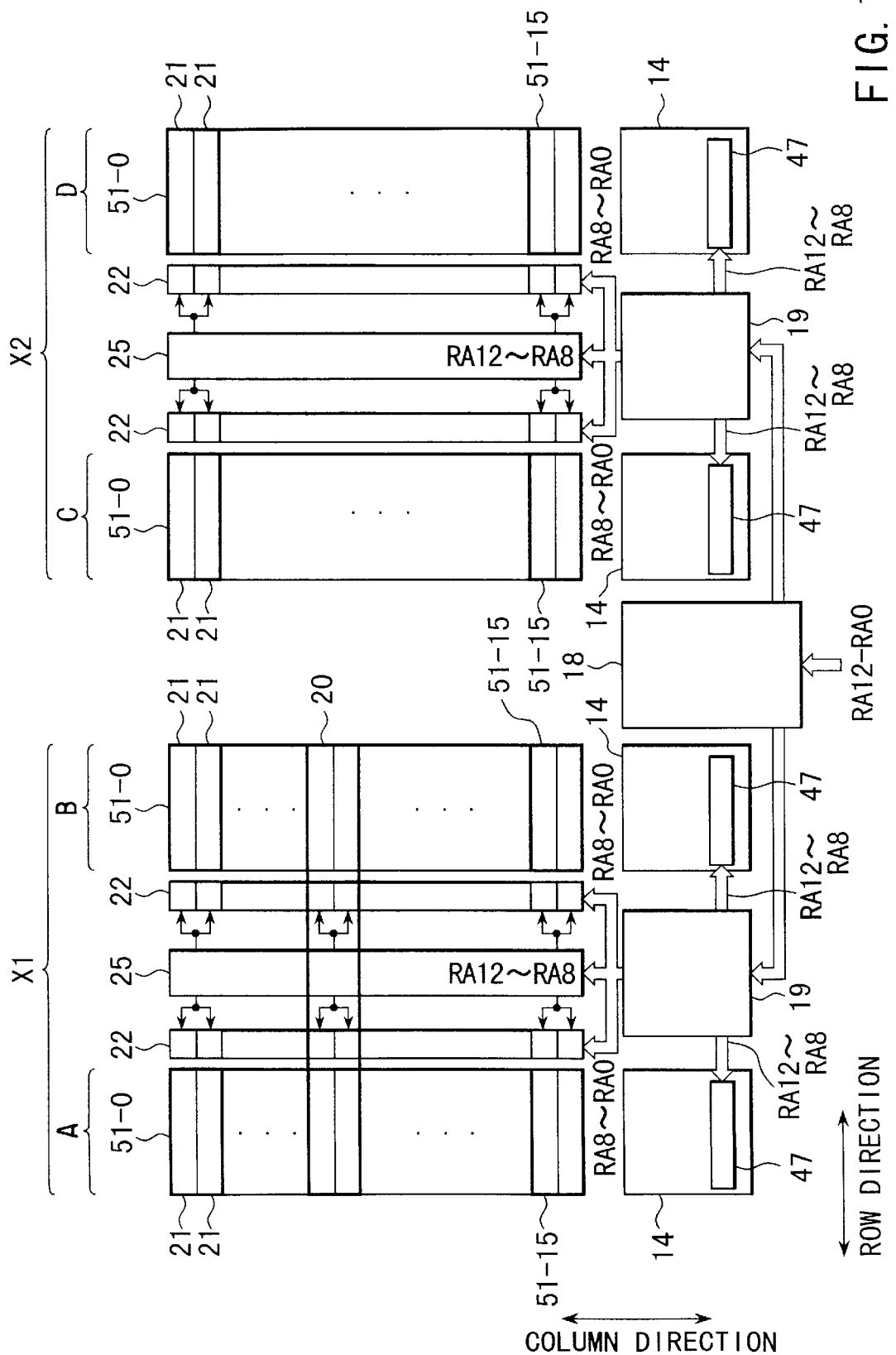
FIG. 10 is a representation showing flows of address signals in the memory macro of FIG. 2.

FIG. 10 schematically shows flows of row address signals in a memory macro of FIG. 2.

In the example, memory segments 20 continuously disposed along an column direction are provided as two columns X1, X2 and each of the two columns X1, X2 are composed of from a minimal one memory segment to a maximal 16 memory segments. Memory segments 20 are separated to two groups with a row decoder 22 and a block decoder 25 as a boundary therebetween and for this reason, four sub-block columns A–D are formed in a memory macro. Input/output data blocks 14 are respectively provided for sub-block columns and therefore, the number of the input/output data blocks 14 are four.

A redundancy circuitry is disposed in an input/output block 14 and provided for each sub-block column. A redundancy memory is provided for each of blocks 51-i (i=0, 1, . . . 15) each of which is composed of two sub-blocks 21. A redundancy memory is provided for each sub-block 21 and a remedy efficiency of a defective cell can be increased, whereas in this way, a total memory capacity of redundancy memories grows to a capacity more than two times as much as in this example, which makes a area for redundancy circuitries larger.

A row address signal RA12 to RA0 is input to a control block 19 via a control block 18. The control block 19 supplies not only a row address signal RA12 to RA8 to the block decoder 25 as a block address signal, but also a row address signal RA8 to RA0 to the row decoder 22. Each block decoder 25 selects one block 51-i in the sub-block columns A–D.

Each control block 19 supplies a row address signal RA12 - RA8 as a redundancy memory selection address signal to a redundancy memory decoder 47 in an input/output data block 14. A redundancy memory decoder 47 selects a redundancy memory corresponding to a selected block 51-i based on a redundancy memory selection address signal. In a redundancy memory, for example, there are stored data indicating whether or not there is a defective data line pair and, when there is a defective data line pair, data which specifies the defective data line pair.

Figure 11:
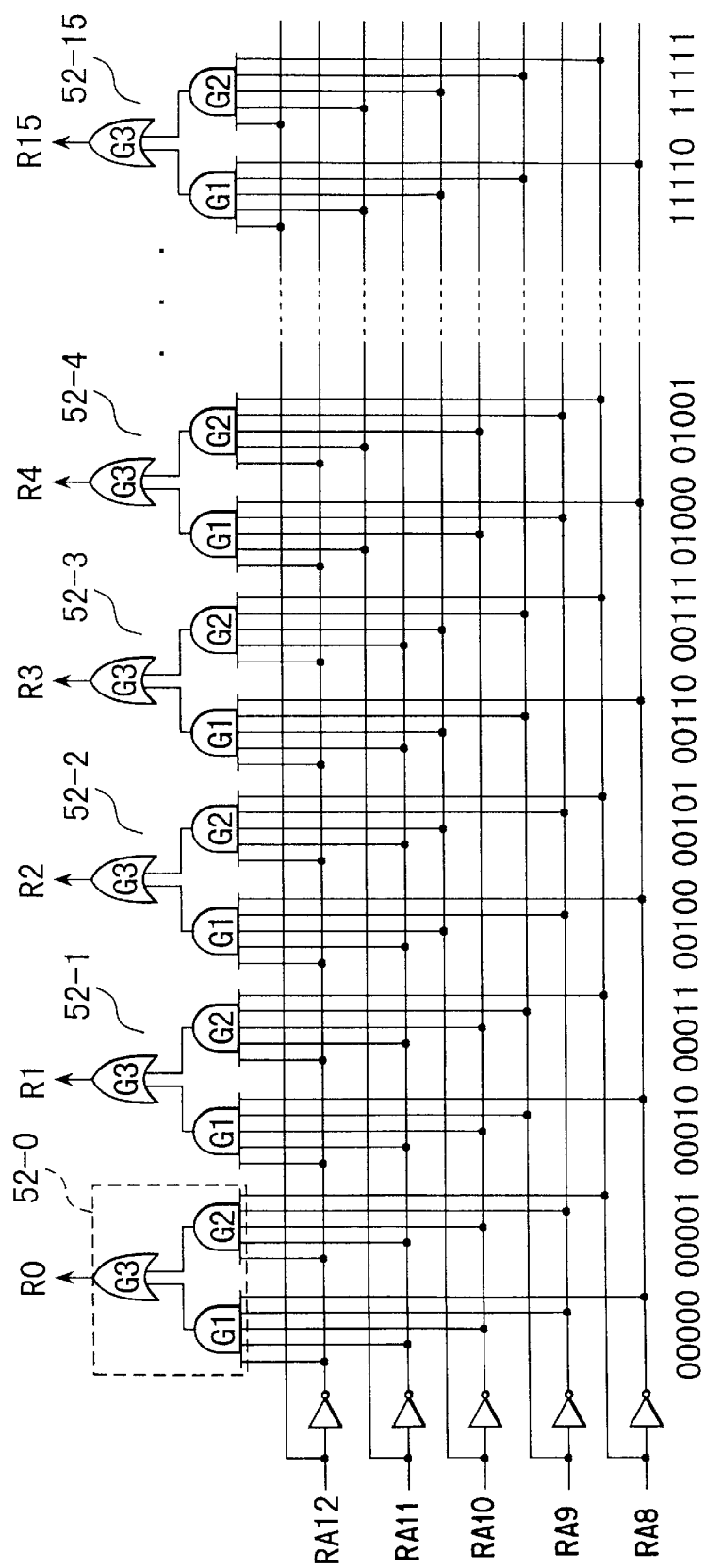
FIG. 11 is a circuit diagram showing an example of a block decoder.

FIG. 11 shows an example of a circuit diagram of the block decoder 25 of FIG. 10.

Logic circuits 52-i (i=0, 1, . . . 15) are provided in a corresponding manner to blocks of the sub-block columns. In this example, since 16 blocks are provided in one sub-block column, the number of the logic circuits 52 is 16. Each logic circuit 52-i is composed of two AND circuits G1, G2 and an OR circuit G3 to which output signals from the AND circuits G1, G2 are input. The AND circuits G1, G2 of each logic circuit 52-i are input with row address signals (block address signals) RA12 . . . RA8 which are different form each another. In other words, one of output signals RA0 . . . RA15 of the logic circuits 52-0 . . . 52-15 assumes "1" and the others all assume "0".

For example, when a row address signal RA12 . . . RA8 is "00000", an output signal of the AND circuit of the logic circuit 52-0 becomes "1" and hence an output signal R0 of the OR circuit G3 of the logic circuit 52-0 becomes "1". At this time, the output signals R1 to R15 of the logic circuits 52-1 to 52-15 all are "0". Therefore, a block corresponding to the logic circuit 52-0 is selected.

When the row address signal RA12-RA8 is "00001", an output signal of the AND circuit G2 of the logic circuit 52-0 becomes "1". At this time, an output signal R0 of the OR circuit G3 of the logic circuit 52-0 becomes "1". When the row address signals RA12 . . . RA8 are "00000" and "00001", output signals of the AND circuit G2 of the logic circuit 52-0 both become "1". It is because the row address signal RA8 does not substantially participated in selection of a block. However, the row address signal RA8 is used for selection of two sub-blocks in a block.

Figure 12:
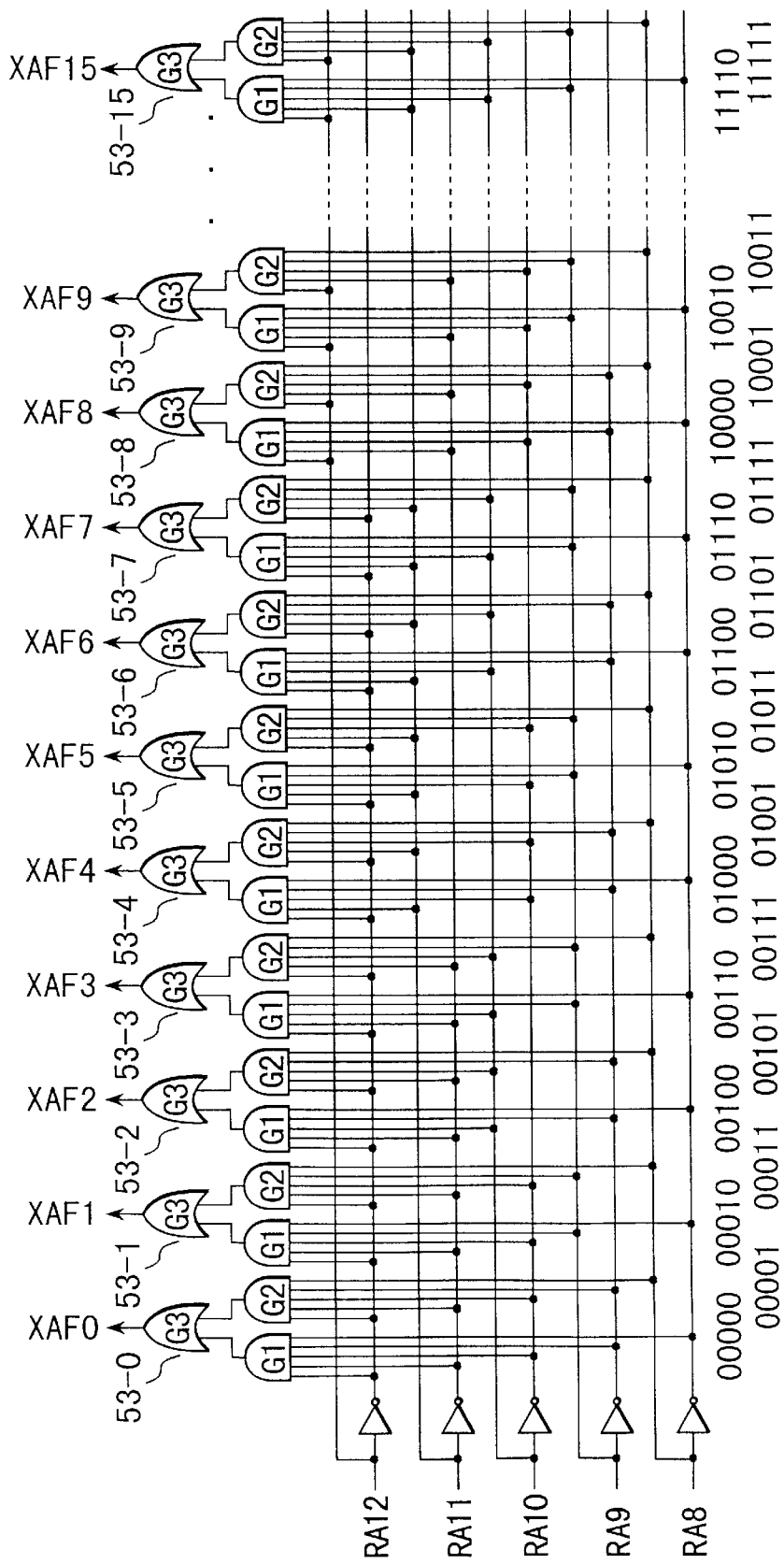
FIG. 12 is a circuit diagram showing an example of a redundancy memory decoder.

FIG. 12 shows an example of a circuit diagram of the redundancy memory decoder 47 of FIG. 10.

The redundancy memory decoder has absolutely the same structure as the block decoder of FIG. 11, as is apparent when compared with the block decoder of FIG. 11.

Logic circuits 53-i (i=0, 1, . . . 15) are provided in a corresponding manner to redundancy memories. The redundancy memories are provided in a corresponding manner to blocks in sub-block columns and hence, when it is assumed that only one data line pair can be remedied, redundancy memories are present as 16 blocks and the number of the logic circuits 53-i is also 16. In one block of a redundancy memory, stored are, for example, data (1 bit) indicating whether or not there is a defective data line pair is present and, when the defective data line is present, data for specifying the defective data line pair (6 bits, whereby 64 pairs can be selected).

Each logic circuit 53-i is composed of two AND circuits G1, G2 and an OR circuit G3 to which output signals of the two AND circuits G1, G2 are input. In the AND circuits G1, G2 of each logic circuit 53-i, redundancy memory selection address signals (corresponding to block address signals) RA12 . . . RA8 are input, which are different from each other. In other words, one of output signals XAF0 to XAF15 of the logic circuits 53-0 . . . 53-15 assumes "1" and all of the rest assume "0".

For example, redundancy memory address signal RA12 . . . RA8 assumes "00000", an output signal of an AND circuit G1 of the logic circuit 53-0 becomes "1" and therefore, an output signal XAF0 of the OR circuit G3 of the logic circuit 53-0 becomes "1". At this time, all output signals XAF1 . . . XAF15 of the logic circuits 53-1 . . . 53-15 assume "0". Accordingly, one block of a redundancy memory corresponding to the logic circuit 53-0 is selected. When the redundancy memory address signal RA12 . . . RA8 assumes "00001", an output signal of the AND circuit G2 of the logic circuit 53-0 assumes "1". At this time, as well, an output signal XAF0 of the OR circuit G3 of the logic circuit 53-0 assumes "1".

In such a manner, a redundancy memory decoder performs the same operation as a row decoder (block decoder).

Figure 13:
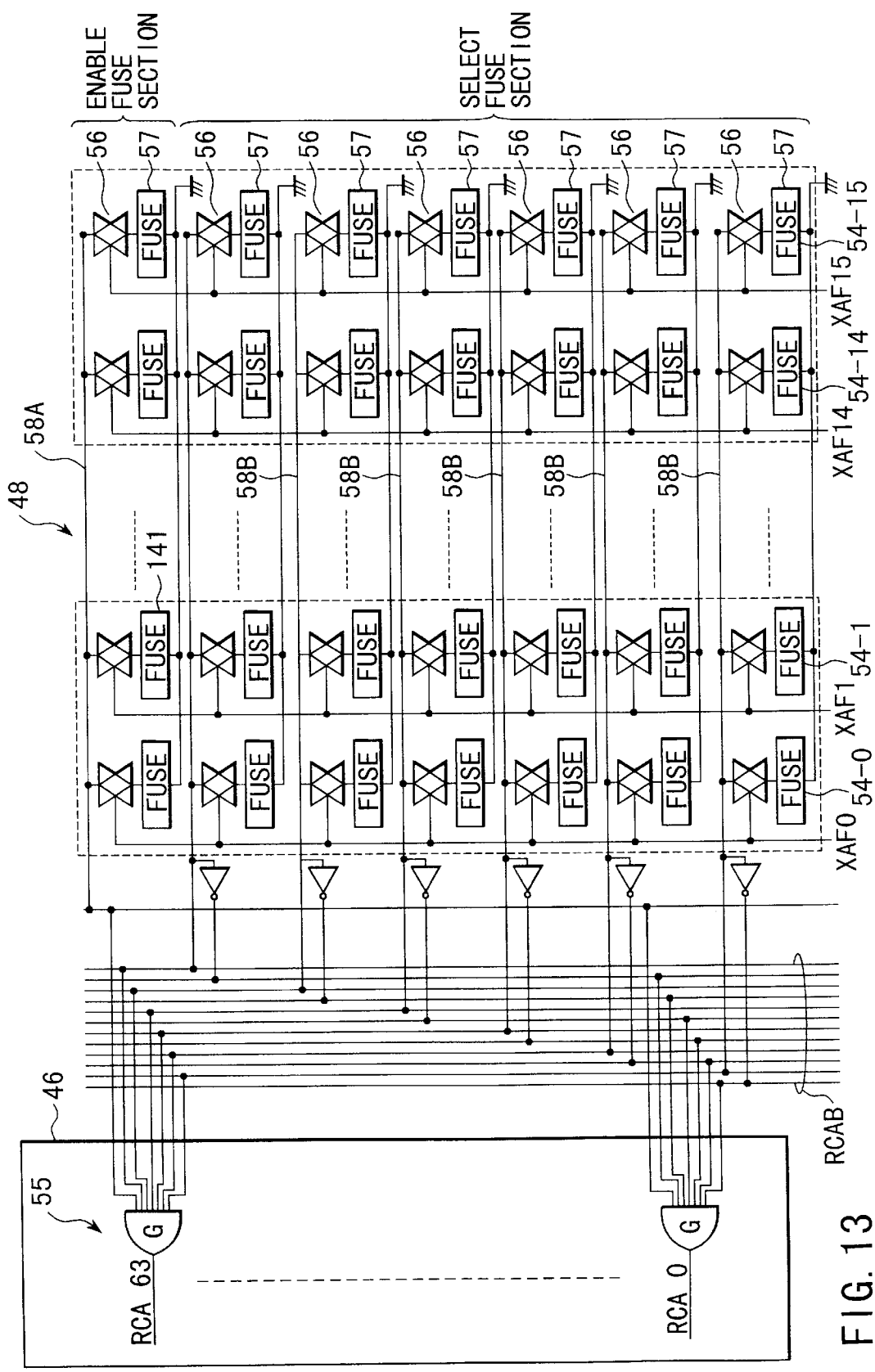
FIG. 13 is a block diagram showing an example of a redundancy memory.

FIG. 13 shows an example of a structure of redundancy memory.

A redundancy memory is provided in a corresponding manner to blocks in sub-block columns. When it is assumed the case where only one data line pair can be remedied, redundancy memories are provided as 16 blocks 54-0 . . . 54-15. One block of a redundancy memory is composed of an enable fuse section on which data (one bit) indicating whether or not there is present a defective data line pair and, when a defective data line pair is present, a selection fuse section on which stored is data (six bits) for specifying the defective data line pair.

An enable fuse section and a selection fuse section are respectively connected, at one end, to fuse data output lines 58A, 58B via transfer gates 56 and each of the other ends thereof is constituted of a fuse element which is connected to a grounding position. The fuse element is, for example, made of polysilicon.

When a defective data line pair is present in connection to a block 51-i of a sub-block column of FIG. 10, cut off is a fuse of the enable fuse section in the block 54-i of a redundancy memory corresponding to the block 51-i (data "1" is stored). There is stored data which specifies a defective data line pair on the fuse of a selection fuse section in the block 54-i of a redundancy memory corresponding to the block 51-i.

Each of blocks 54-0, ... 54-15 of a redundancy memory is input with one of output signals XAF0, ... XAF15 of a redundancy memory decoder. For example, a signal XAF0 is input to the block 54-0. When the signal XAF0 is "1", a transfer gate 56 in the block 54-0 assumes the on state. Accordingly, when the signal XAF0 is "1", data stored in the block 54-0 are input to a decoder 55 in a multiplexer 46 via fuse data output lines 58A, 58B and a redundancy column address bus RCAB.

Fuse data output lines 58A, 58B are precharged at, for example, a source potential VCC, that is in the state of data "1". Thereafter, when a block 54-i is selected and a transfer gate 56 in the block assumes the on state, and when a fuse of an enable fuse section of the block 54-i is cut off, the fuse data output line 58A retains the state of data "1". On the contrary, when the fuse of an enable fuse section of the block 54-i is not cut off, the fuse data output line 58A assumes, for example, the earth potential VSS, that is the state of data "0".

When the fuse of an enable fuse section is not cut off and data "0" is output onto the fuse data output line 58A, output signals RCA0, ... RCA63 of all AND circuits constituting the decoder 55 in the multiplexer 46 assume "0". When the fuse of an enable fuse section is not cut off, a fuse of a selection fuse section is not cut off either and data "0" are output to all of the fuse data output lines 58A, 58B. Accordingly, the multiplexer section 46 selects one of the ordinary data line pairs DQ0, ... DQ63, /DQ0, ... /DQ63 but does not select a spare data line pair SDQ, /SDQ.

When the fuse of an enable fuse section is cut off, and when data "1" are output onto the fuse data output line 58A, one of output signals RCA0, ... RCA63 of AND circuits constituting the decoder 55 in the multiplexer 46 assumes "1" based on data of six bits of the selection fuse section (64 data line pairs can be selected). Therefore, when an output signal RCAi is "1", the multiplexer section 46 replaces a data line pair DQi, /DQi corresponding to an output signal RCAi with a spare data line pair SDQ, /SDQ.

Figure 14:
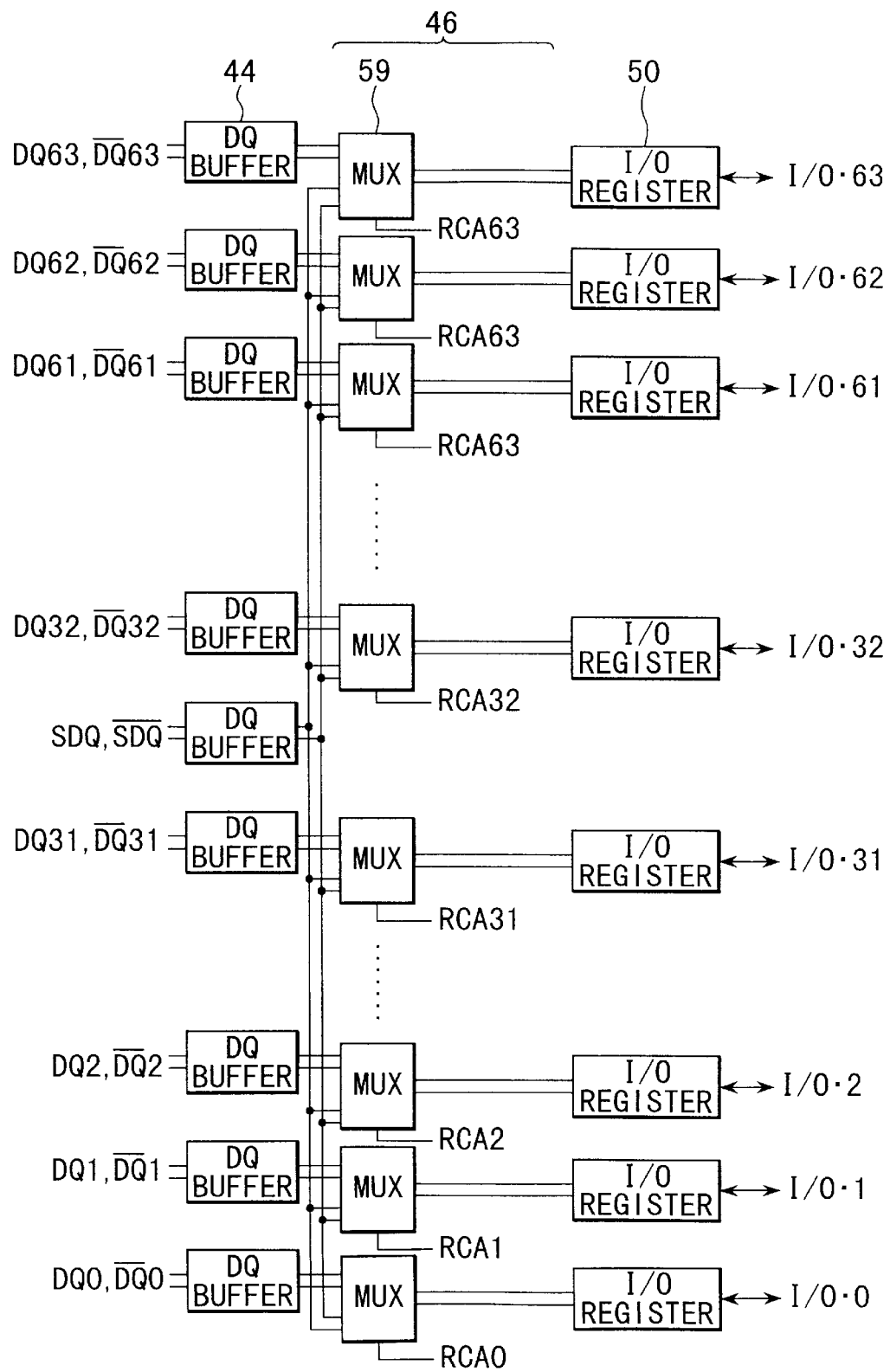
FIG. 14 is a block diagram showing a multiplexer to which an output signal of the redundancy memory is input and its peripheral circuits.

FIG. 14 shows a switching section between data line pairs DQ0, ... DQ63, /DQ0, ... /DQ63 and a spare data line pair SDQ, /SDQ.

Sixty four multiplexers 59 are provided in a corresponding manner to 64 data line pairs DQ0, ... DQ63, /DQ0, ... /DQ63. Spare data line pairs SDQ, /SDQ are connected to all the multiplexers 59. A decoder of a multiplexer section 46 decodes fuse data of 7 bits and generates a redundancy column address signal RCA0 to RCA63. The redundancy column address signal RCA0 to RCA63 is input to a multiplexer 59.

When there is no defective data line pair, all the redundancy column address signals RCA0 to RCA63 as a result of decoding of fuse data assume "0" and all the multiplexers 58 select data line pairs DQ0, ... DQ63, /DQ0, ... /DQ63. On the other hand, when there is an defective data line pair, one of the redundancy column address signals RCA0 to RCA63 assumes "1" and the others assume "0". Accordingly, a multiplexer 58 to which data "1" is input selects a spare data line pair SDQ, /SDQ.

Figure 15:
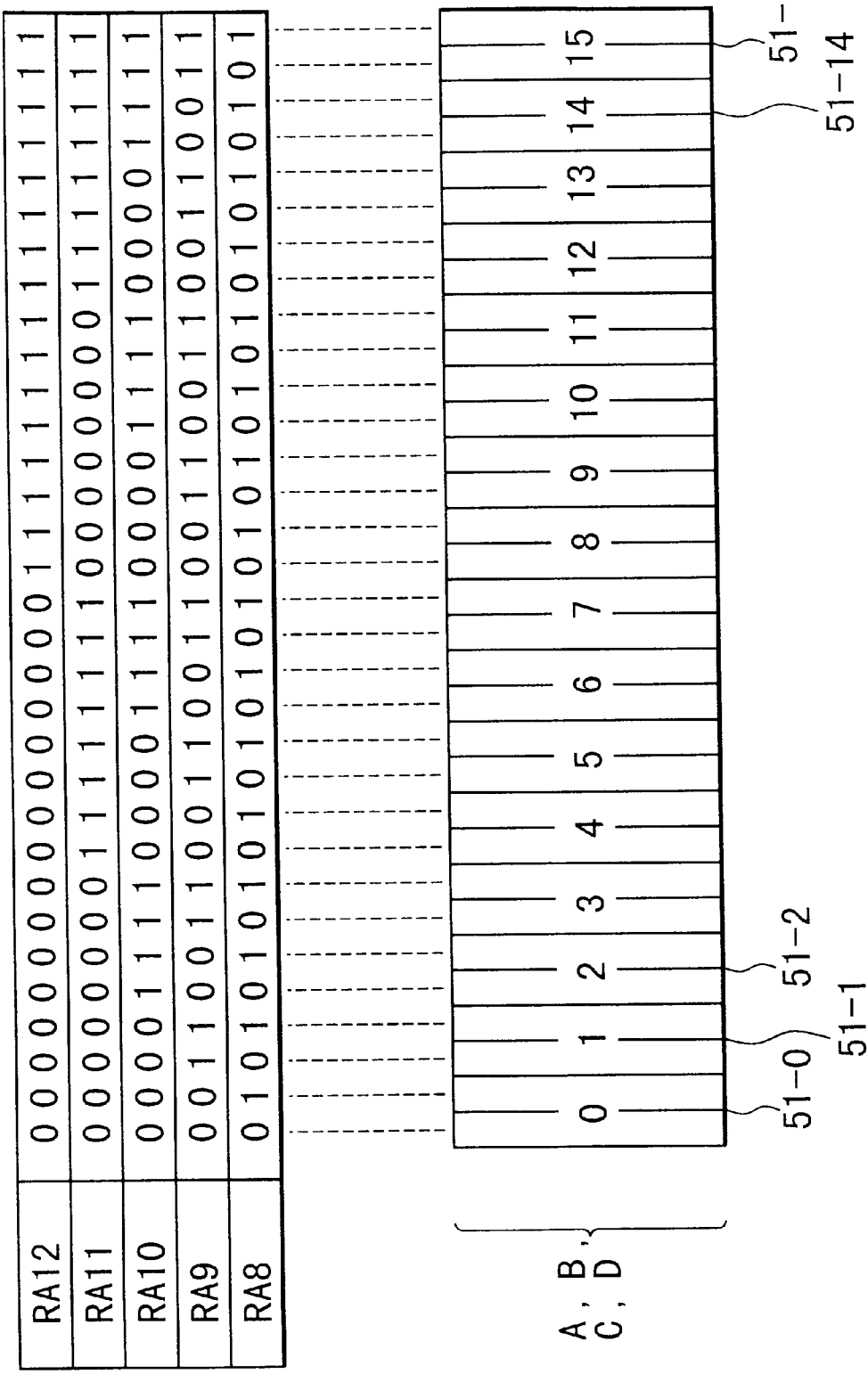
FIG. 15 is a representation showing a corresponding relation between a block address signal and a selected block in a sub-block column.
Figure 16:
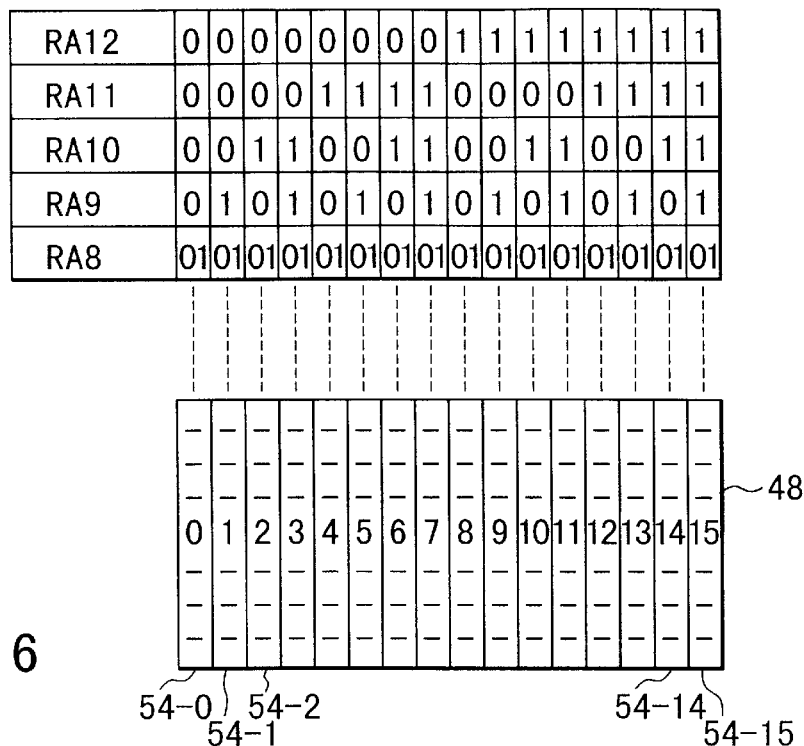
FIG. 16 is a representation showing a corresponding relation between a redundancy memory selection address signal and a selected block in a redundancy memory.

FIG. 15 shows a relation between row address signals (block address signals) RA12, ... RA8 and a selected block 51-i of sub-block columns A, B, C, D. FIG. 16 also shows a relation between redundancy memory selection address signals (same as block address signals) RA12, ... RA8 and a selected block 54-i of a redundancy memory 48.

As is clear for the figures, a block 51-i of the sub-block columns A, B, C, D and a block 54-i of the redundancy memory 48 are in a condition of one to one correspondence and the numbers of blocks of the sub-block columns is same as that of the redundancy memory. In this example, since the number of blocks of the sub-block columns A, B, C, D is set to 16, the number of blocks of the redundancy memory 48 is also set to 16.

Since the number of blocks 51-i and the number of blocks 54-i are both 16, in other word the fourth power of 2, used is the higher order RA12, ... RA9 of four bits among the row address signals RA12, ... RA0 as an address signal for selection of a block. The row address signal RA8 does not substantially contribute to selection of a block.

Figure 17:
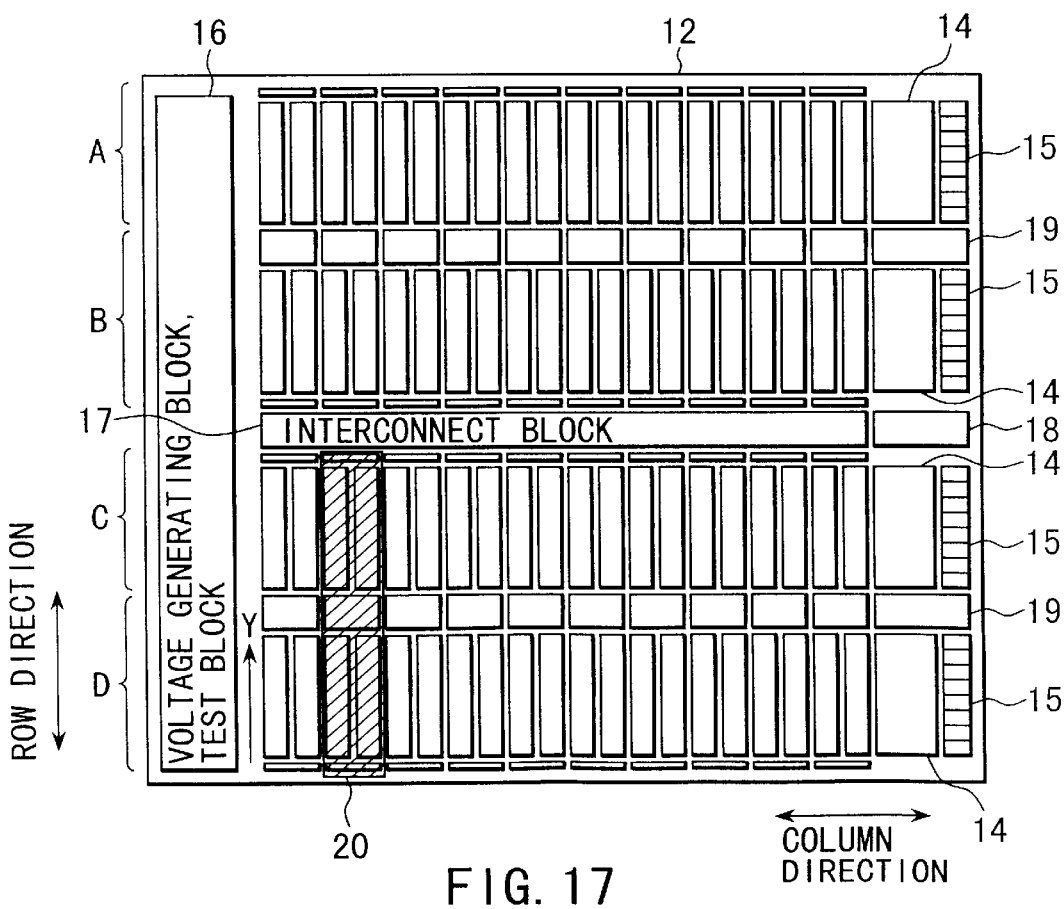
FIG. 17 is a representation showing a floor plan in a memory macro.

FIG. 17 shows an example of a floor plan in the case where a memory capacity of the memory macro of FIGS. 2 and 10 is decreased.

For example, a MERGED MEMORY-LOGIC LSI has a feature that a memory capacity of a memory macro can be changed by increase or decrease in the number of memory segments of the memory macro. Then, in this example, considered is the case where a memory capacity of the memory macro is adjusted to 20 megabits. In this case, the number of memory segments 20 is 20. A floor plan of the memory macro of this example is different from the floor plan of the memory macro of 32 megabits shown in FIG. 2 only in that the numbers of memory segments 20 are different from each other.

Figure 18:
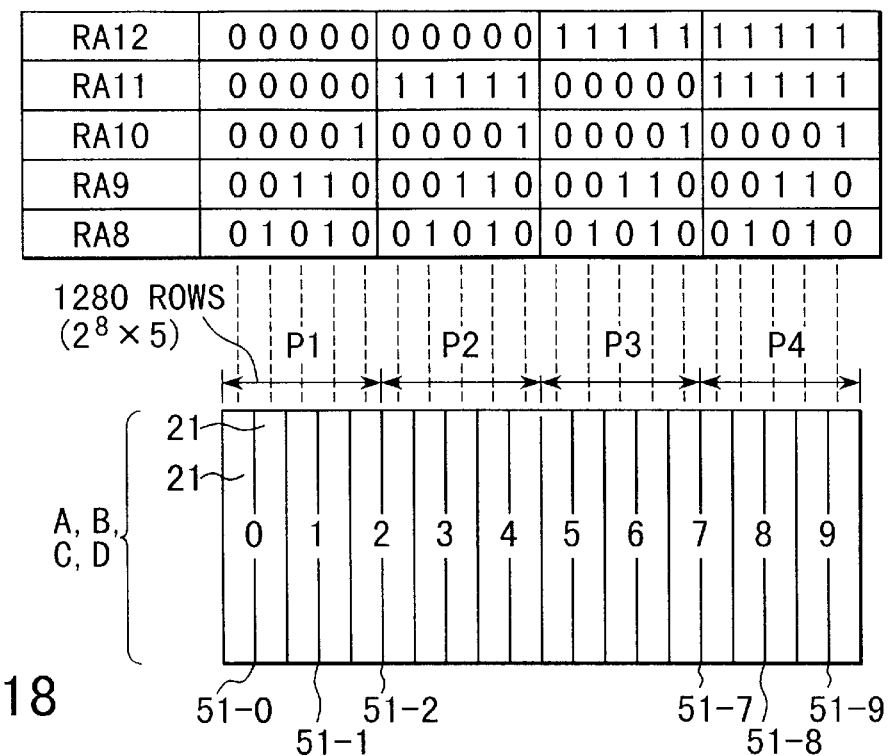
FIG. 18 is a representation showing a corresponding relation between a block address signal and a selected block in a sub-block column.
Figure 19:
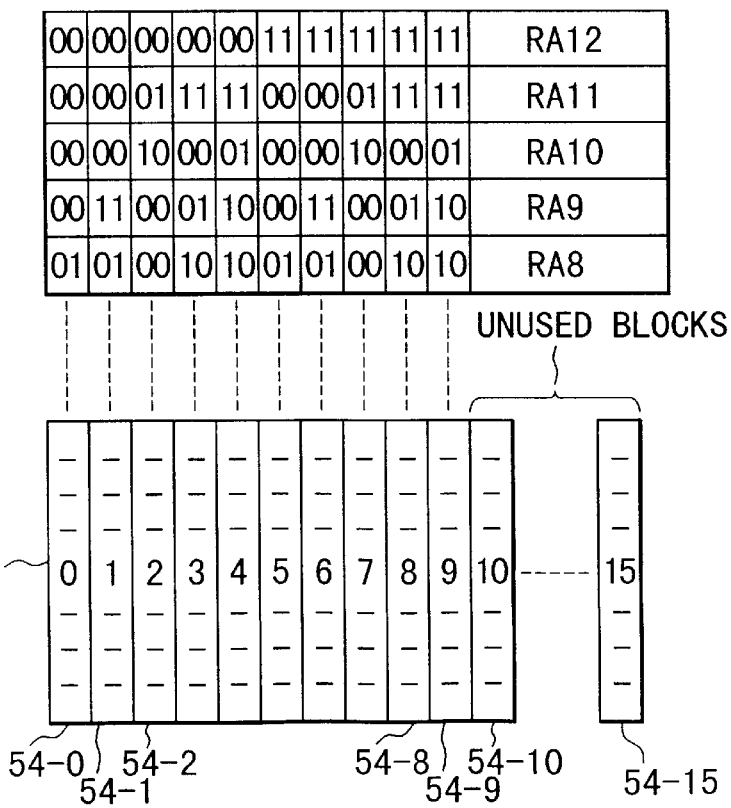
FIG. 19 is a representation showing a corresponding relation between a redundancy memory selection address signal and a selected block in a redundancy memory.

FIG. 18 shows a relation between row address signals (block address signals) RA12, ... RA8 and a selected block 51-i of sub-block columns A, B, C, D. FIG. 19 shows a relation between redundancy memory selection address signals (same as block address signals) RA12, ... RA8 and a selected block 54-i of a redundancy memory 48.

When the number of the sub-block columns A, B, C, D is 10, a structure of a block decoder is different from the structure of the block decoder in the case where the number of blocks of the sub-block columns A, B, C, D shown in FIG. 15 is 16. In this example, the number of the sub-block columns A, B, C, D is 10 and the number cannot expressed in the form of the nth power of 2 ($2^n$). Therefore, the ten blocks 51-0, ... 51-9 are divided into four regions P1, ... P4 each of which is allocated by 2.5 blocks (5 sub-blocks 21 each).

In this case, one region has 1280 (512+512+256) rows. However, 1280 is expressed by ($2^8 \times 5$) but cannot be expressed in the form of the nth power of 2 ($2^n$). Accordingly the address signal RA12, ... RA8 which selects a block becomes discontinuous at boundaries among the four regions.

Blocks 51-2, 51-7 are divided into two parts by the boundaries P1, ... P4. Address assignment is provided so that the divided two parts can independently be selected and block decoders are structured based on the assignment.

On the other hand, even though a memory capacity of a memory macro is changed, a memory capacity (the number of blocks) of a redundancy memory is not changed. For example, when the maximal number of blocks of sub-block columns in the memory macro is 16, the number of blocks of the redundancy memory is always set to 16. Thereby, even when a memory capacity of the memory macro is changed, there is no requirement for a great change in designing of a redundancy circuitry.

However, the number of blocks which are actually used among 16 blocks 54-0, . . . 54-15 of a redundancy memory is 10. That is, if blocks 51-i of the sub-block columns A, B, C, D and blocks 54-i of the redundancy memory 48 are made to correspond to each other block by block, there remains six blocks 54-10, . . . 54-15 in the unused state.

Figure 20:
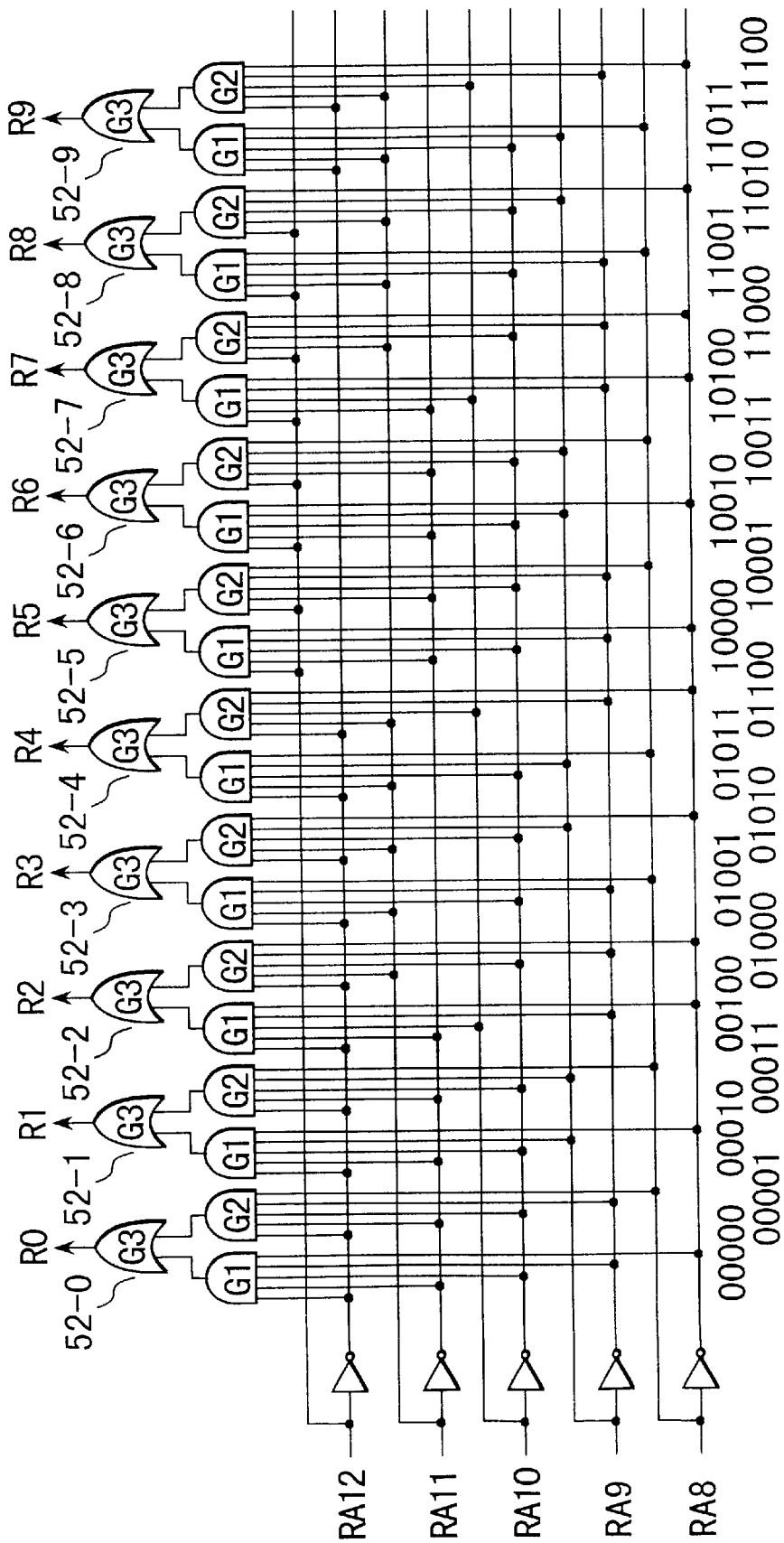
FIG. 20 is a circuit diagram showing an example of a block decoder.

FIG. 20 shows an example of a circuit structure of a block decoder in the case where the memory macro of FIGS. 17 to 19 is adopted.

Logic circuits 52-i (i=0, 1, . . . 9) are provided in a corresponding manner to block s in sub-block columns. In this example, since 10 blocks are provided in one sub-block column, the number of logic circuits 52-i is 10. A logic circuit 52-i is composed of two AND circuits G1, G2 and an OR circuit G3 to which output signals of the AND circuits G1, G2 are input. To AND circuits G1, G2 of each logic circuit 52-i, row address signals (block address signals) RA12, . . . RA8 which are different form each other are input. A correspondence between row address signals RA12, . . . RA8 and a selected block 51-i are set as shown in FIG. 18.

Accordingly, one of output signals R0, . . . R9 of the logic circuits 52-0, . . . 52-9 assumes "1" and all the rest assume "0". For example, when the row address signal RA12, . . . RA8 is "00000", since an output signal of the AND circuit Gi of the logic circuit 52-0 assumes "1", an output signal R0 of the OR circuit G3 of the logic circuit 52-0 assumes "1". At this time, all output signals R1 to R9 of the logic circuits 52-1, . . . 52-9 are "0". Accordingly, a block corresponding to the logic circuit 52-0 is selected.

When the row address signal RA12, . . . RA8 is "00001", an output signal of the AND circuit G2 of the logic circuit 52-0 is "1". At this time, as well, an output signal R0 of the OR circuit G3 of the logic circuit 52-0 assumes "1". When the row address signals RA12, . . . RA8 are "00000" and "00001", output signals of the AND circuit G2 of the logic circuit 52-0 are "1" in both cases.

Figure 21:
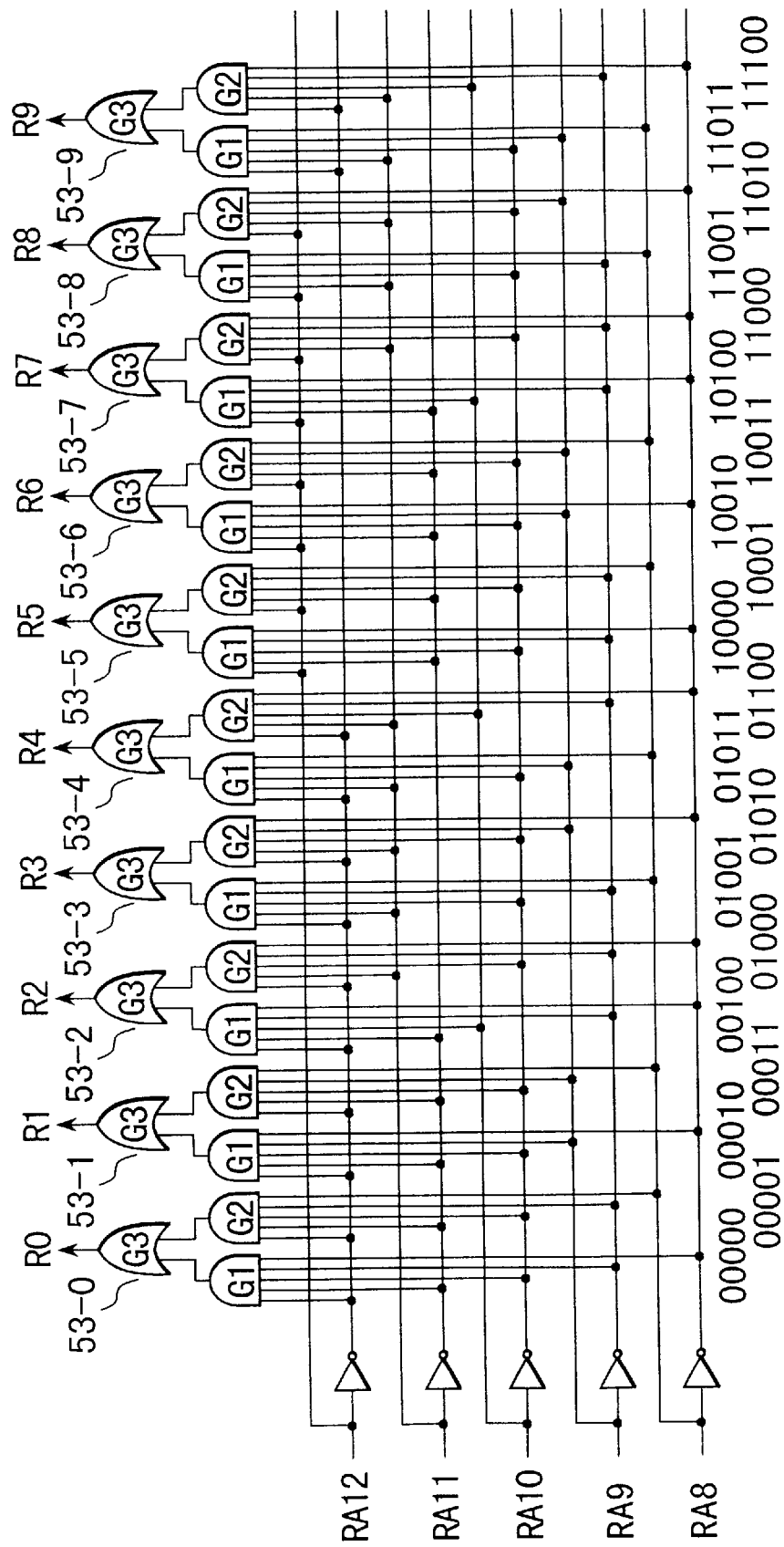
FIG. 21 is a circuit diagram showing an example of a redundancy memory decoder.

FIG. 21 shows an example of a circuit structure of a redundancy memory decoder in the case where the memory macro of FIGS. 17 to 19 are adopted.

The redundancy memory decoder has the same structure as that of the block decoder of FIG. 20 as is apparent when compared.

Logic circuits 53-i (i=0, 1, . . . 9) are provided in a corresponding manner to redundancy memories. Redundancy memories includes 16 blocks, whereas blocks which are actually used are only 10 blocks 54-0, 54-9 as shown in FIG. 19, and the rest blocks 54-10, 54-15 are not used. Accordingly the number of logic circuits 53-i is 10.

A logic circuit 53-i is composed of two AND circuits G1, G2 and an OR circuit G3 to which output signals of the tow AND circuits G1, G2 are input. To the AND circuits G1, G2 of each logic circuit 53-i, input are redundancy memory selection address signals (corresponding to block address signals) RA12, . . . RA8 which are different form each other. A correspondence between the redundancy memory selection address signals RA12, . . . RA8 and a selected block 54-i is set as shown in FIG. 19.

Accordingly, one of output signals XAF0, . . . XAF9 of the logic circuits 53-0, . . . 53-9 assumes "1" and all the rest assumes "0". For example, when the redundancy memory address signal RA12, . . . RA8 is "00000", an output signal XAF0 of the AND circuit G1 of the logic circuit 53-0 becomes "1" and hence an output signal XAF0 of the OR circuit G3 of the logic circuit 53-0 becomes "1". At this time, output signals XAF1, . . . XAF15 of the logic circuits 53-1, . . . 53-9 all assumes "0". Accordingly, one block of the redundancy memory corresponding to the logic circuit 53-0 is selected. When the redundancy memory address signal RA12, . . . RA8 is "00001", an output signal of the AND circuit G2 of the logic circuit 53-0 is "1". At this time, as well, an output signal XAF0 of the OR circuit G3 of the logic circuit 53-0 assumes "1".

In this example, when a memory capacity, that is the number of memory segments, of a memory macro is changed, redesigning have to be performed on a row decoder (block decoder) and a redundancy memory decoder. However, even though a memory capacity of the memory macro is changed, a memory capacity of a redundancy memory is not changed. That is, a redundancy memory always has blocks corresponding the maximal memory capacity of a memory macro and when a memory capacity of the memory macro is decreased, a part of the blocks of the redundancy memory is not be used.

Accordingly, in a semiconductor memory for which there is applied a designing method which changes a memory capacity by increase or decrease in the number of memory segments, circuit designing can be performed without a great change in a structure of a redundancy circuitry even when a memory capacity is changed.

As has been described above, when a MERGED MEMORY-LOGIC LSI with a memory macro having a memory capacity which meets a user's desire is designed, according to the present invention, a redundancy circuitry is not resigned and the maximal memory capacity (the number of blocks) thereof are always secured. Blocks of a redundancy memory of the number which corresponds to the number of blocks of sub-block columns are used and the rest are left unused. In this case, a row decoder (block decoder) and a redundancy memory decoder have to be subjected to redesigning based on a block address signal and a redundancy memory selection address signal, whereas a designing time is greatly decreased as compared with the case where a redundancy circuitry is designed from its very initial stage.

FIG. 22 is an example of a floor plan of a MERGED DRAM-LOGIC LSI for which the present invention is applied.

In a semiconductor chip 10, there is configured a logic section 11, a memory macro 12 and a PAD section 13. In the logic section 11, a circuit block having a function other than a semiconductor memory is formed. The memory macro 12 has a function of a DRAM (dynamic random access memory) and in the memory macro 12, a series of completion type operations of writing data, reading data and the like can be performed. The PAD section 13 is disposed along the periphery of the semiconductor chip 10 and provided with pads for input of a control signal and input/output of data.

Figure 23:
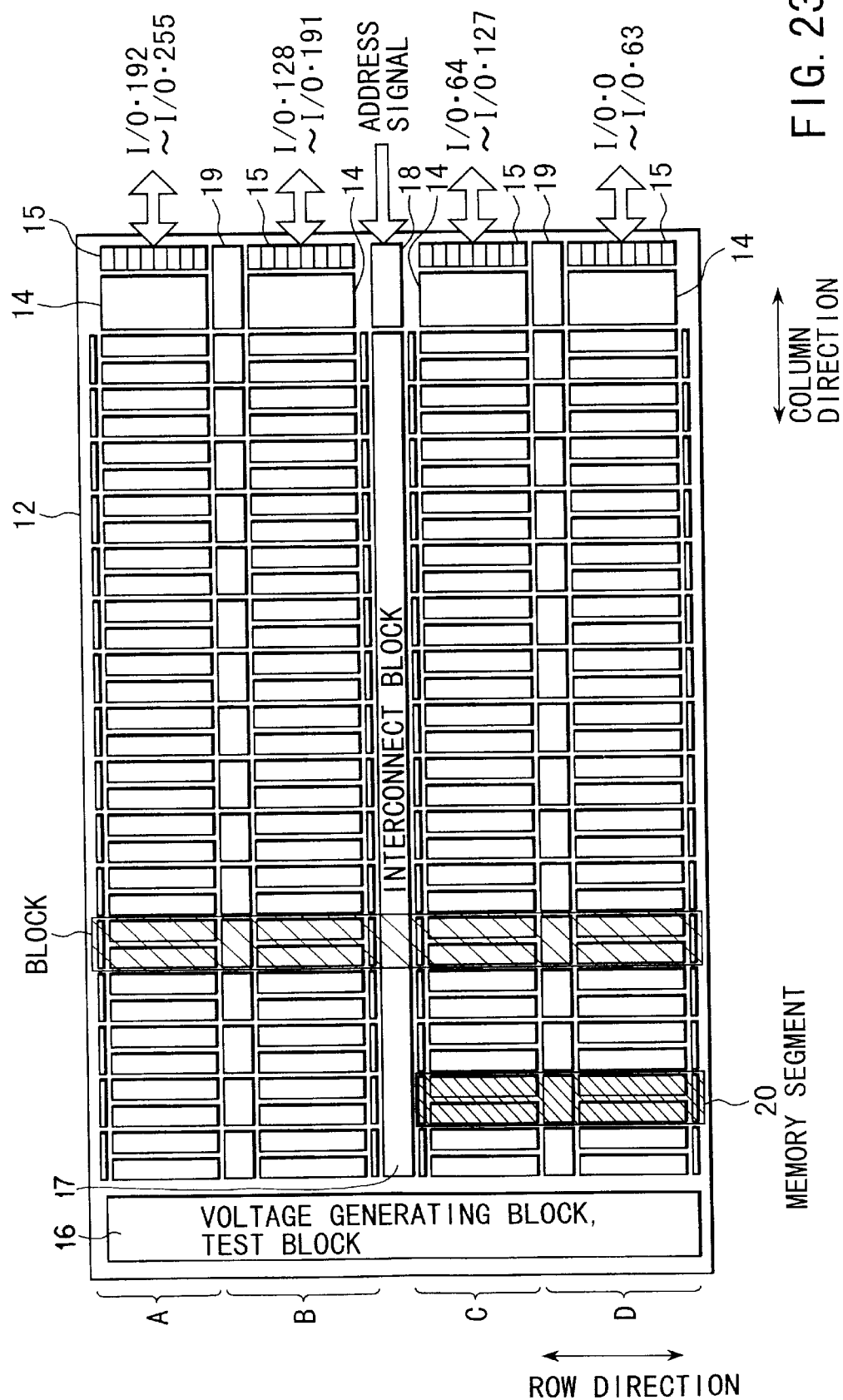
FIG. 23 is a representation of a floor plan in a memory macro.

FIG. 23 shows an example of a floor plan of the memory macro of FIG. 22.

At one end of a memory cell 12 in a column direction, a voltage generating block and a test block 16 are disposed. In the voltage generating block, there are formed circuits to generate voltages such as a substrate voltage, a word line voltage and a bit line voltage and in the test block, there is formed a circuit to perform a test of a memory cell. At the other end of the memory macro 12 in a column direction, input/output data blocks 14 and input/output register blocks 15 are disposed. In an input/output data block 14, there is formed a redundancy circuitry whereby spare cells substitute for a DQ buffer and a defective cell connecting to a dataline (DQ line). In an input/output register block 15, there is formed an input/output register. The input/output register block 15 constitutes an interface between the memory macro and the logic section. In the memory macro 12 of this example, input/output of 256 bit data I/O·0 to I/O·255 can be performed at the same time.

In the middle portion of the memory macro 12, an interconnect block 17 extends long along a column direction. In the interconnect block 17, a source line, a control signal line and the like are formed. At the other end of the memory macro 12 in a column direction a control block 18 is disposed abutting on the interconnect block 17. In the control block 18, there are input circuits for inputting an address signal, a control signal (clock signal), a command signal and the like. Control blocks 19 are respectively inserted between input/output data blocks 14. A control block 19 not only receives an address signal from a control block 18 but supplies address signals to a row decoder and a column decoder.

On both sides of the interconnect block 17, two group of 16 memory segments 20 are respectively disposed along a column direction in a continuous manner. In the memory macro 12, accordingly, a total of 32 memory segments 20 are disposed. Each memory segment 20 comprises, for example, a memory array having a memory capacity of one megabits. In this case, the memory macro 12 has a memory capacity of 32 megabits.

In this example, the number of columns of the memory segments 20 is two (double cell array structure). In this case, the number of the memory segments 20 can be increased or decreased by two, that is a block unit, at a time. Therefore, the minimal number of the memory segments 20 is two and the maximal number is set to $2^n$ (n is a natural number), for example 32 segments. One column of the memory segments 20 can be adopted (single cell array structure). In this case, one memory segment 20 can be selected as the minimal number (the maximal number is $2^n$).

A redundancy circuitry is designed in advance of need assuming the case where the maximal number of the memory segments 20 is $2^n$ and such a redundancy circuitry can be used even when the number of the memory segments 20 is less than $2^n$ segments. In this case, a change in the design of the redundancy circuitry can be restricted to a minimum.

A structure of a memory segment 20 is as shown in FIGS. 3A, 3B, 4A, 4B, 5A, 5B, 6. A structure of a control block 18, 19 is as shown in FIGS. 7 and 8. A structure of an input/output data block 14 is as shown in FIG. 9.

Figure 24:
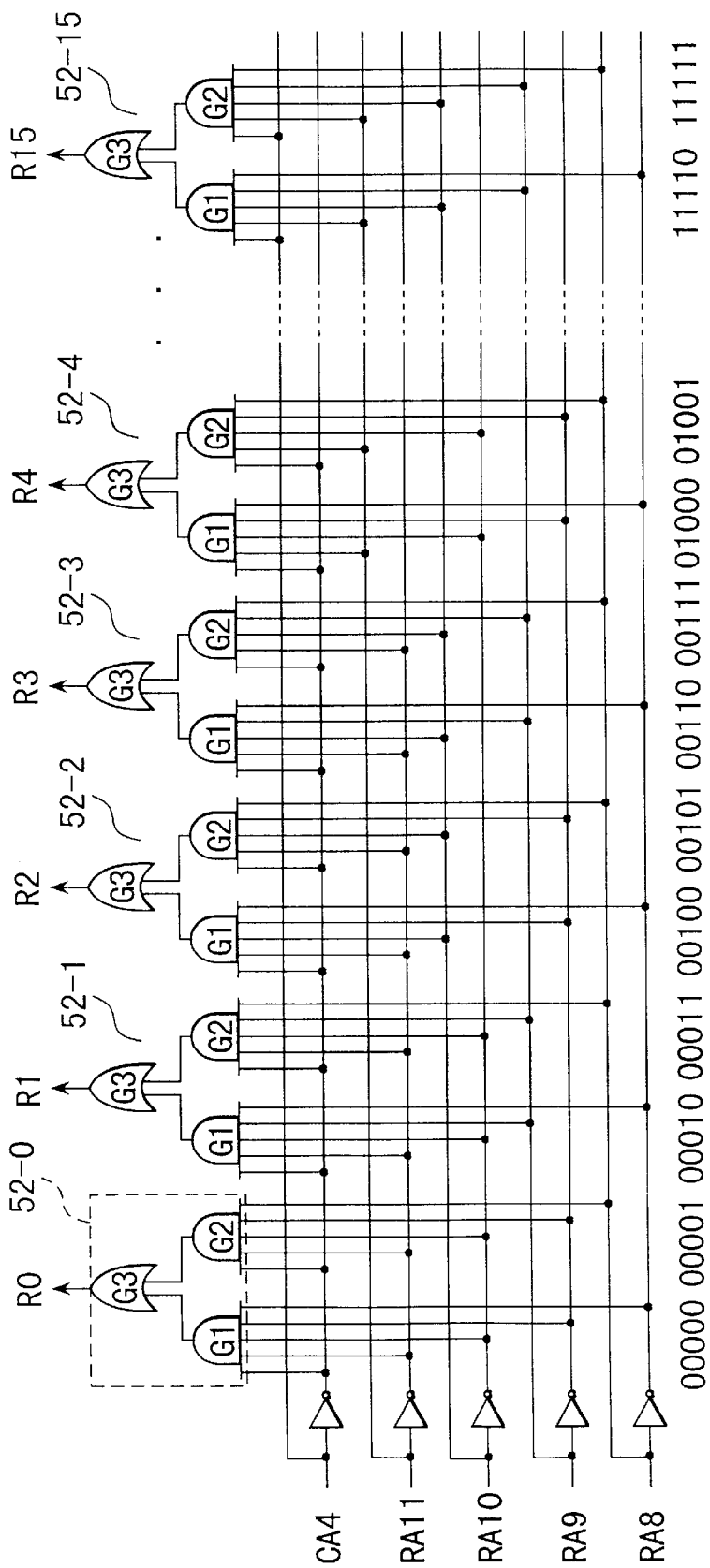
FIG. 24 is a circuit diagram showing an example of a block decoder.

FIG. 24 is an example of a circuit structure of a block decoder in the case where the memory macro of FIG. 23 is adopted.

Logic circuits 52-i (i=0, 1, . . . 15) are provided in a corresponding manner to blocks in a sub-block column. In this example, since 16 blocks are provided in one sub-block column, there are present 16 logic circuits 52-i. A logic circuit 52-i is composed of two AND circuits G1, G2 and an OR circuit G3 to which output signals of the two AND circuits G1, G2 are input. To the AND circuits G1, G2 of a logic circuit, there are input block address signals CA4, RA11, . . . RA8 which are different from each other. That is, one of output signals of the logic circuits 52-0, . . . 52-15 assumes "1" and all the rest assume "0".

For example, when a block address signal CA4, RA11, . . . RA8 are "00000", an output signal of the AND circuit Gi of the logic circuit 52-0 assumes "1" and therefore, an output signal R0 of the OR circuit G3 of the logic circuit 52-0 assumes "1". At this time, output signals R1, . . . R15 of the logic circuits 52-1, . . . 52-15 all assume "0". Accordingly, a block corresponding to the logic circuit 52-0 can be selected.

When block address signal CA4, RA11, . . . RA8 is "00001", both an output signal of the AND circuit G2 of the logic circuit 52-0 are "1". At this time, an output signal R0 of the OR circuit G3 of the logic circuit 52-0 is "1". When block address signals CA4, RA11, . . . RA8 are "00000" and "00001", both output signals of the AND circuit G2 of the logic circuit 52-0 assume "1". It is because the address signal RA8 dose not substantially participated in selection of a block. However, the address signal RA8 is used for selection between two sub-blocks.

In this example, an address signal CA4 is used for the highest order bit of a block address signal, but, for example, a row address signal RA12 may be used instead of the address signal CA4.

Figure 25:
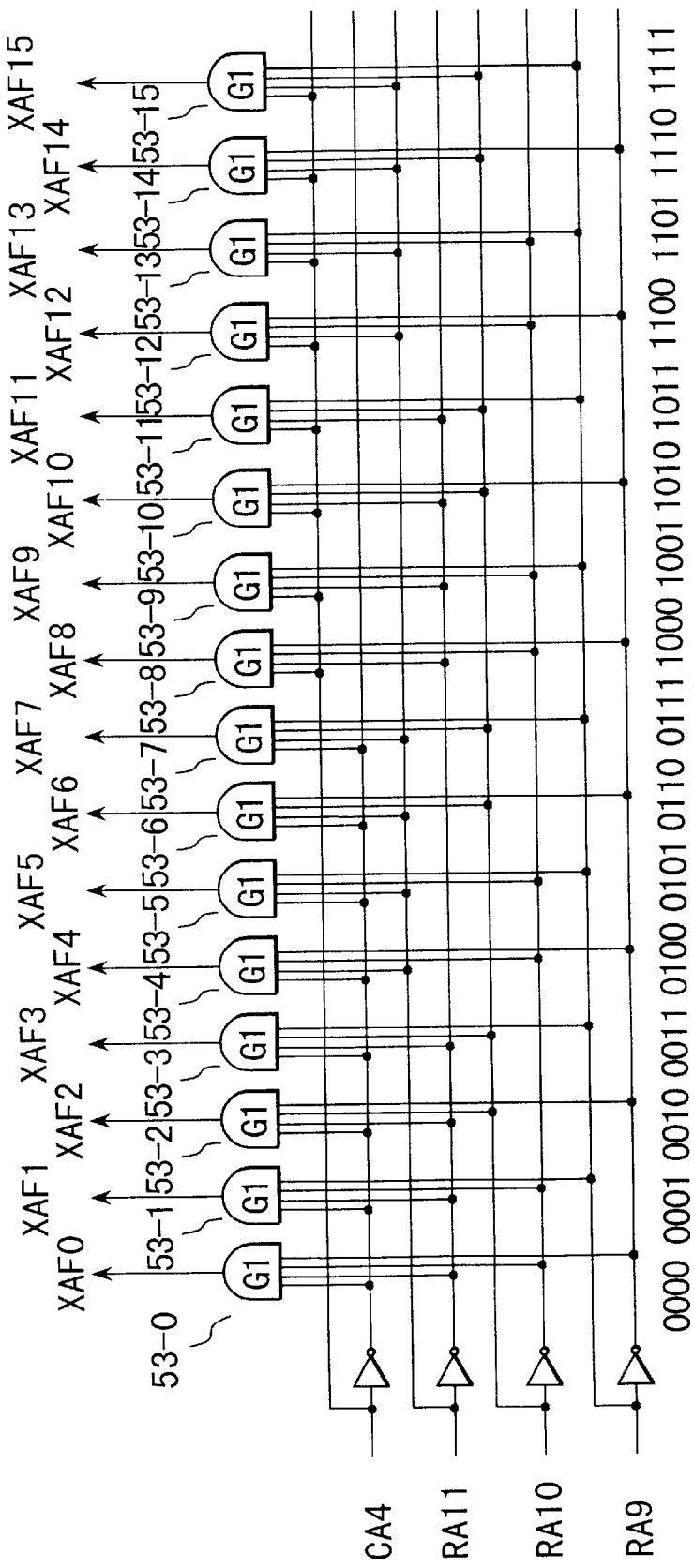
FIG. 25 is a circuit diagram showing an example of a redundancy memory decoder.

FIG. 25 shows an example of a circuit structure of the redundancy memory decoder in the case where the memory macro of FIG. 23 is adopted.

Logic circuits 53-i (i=0, 1, . . . 15) are provided in a corresponding manner to a redundancy memory. The redundancy memory are provided in a corresponding manner to blocks in a sub-block column and therefore, when it is assumed the case where only one data line pair can be remedied, a redundancy memory includes 16 blocks and there are present 16 logic circuits 53-i. In one block of a redundancy memory, there are stored, for example, data (one bit) indicating whether or not there is present a defective data line and data (six bits which can select 64 pairs) which are used for specifying a defective data line pair when the defective data line pair is present.

A logic circuit 53-i comprises an AND circuit G1. To the AND circuit Gl of each logic circuit 53-i, there are input redundancy memory selection address signals (corresponding to block address signals) CA4, RA11, . . . RA9 which are different from each other. That is, one of output signals XAF0, . . . XAF15 of the logic circuits 53-0, . . . 53-15 assumes "1" and all the rest assume "0".

For example, when a redundancy memory address signal CA4, RA11, . . . RA9 is "00000", an output signal XAF0 of the logic circuit 53-0 assumes "1". At this time, all output signals XAF1, . . . XAF 15 of the logic circuits 53-1, . . . 53-15 assume "0". Accordingly, one block of a redundancy memory corresponding to the logic circuit 53-0 is selected. When a redundancy memory address signal CA4, RA11, . . . RA9 is "0001", the output signal XAF 1 of the logic circuit 53-1 assumes "1".

Figure 26:
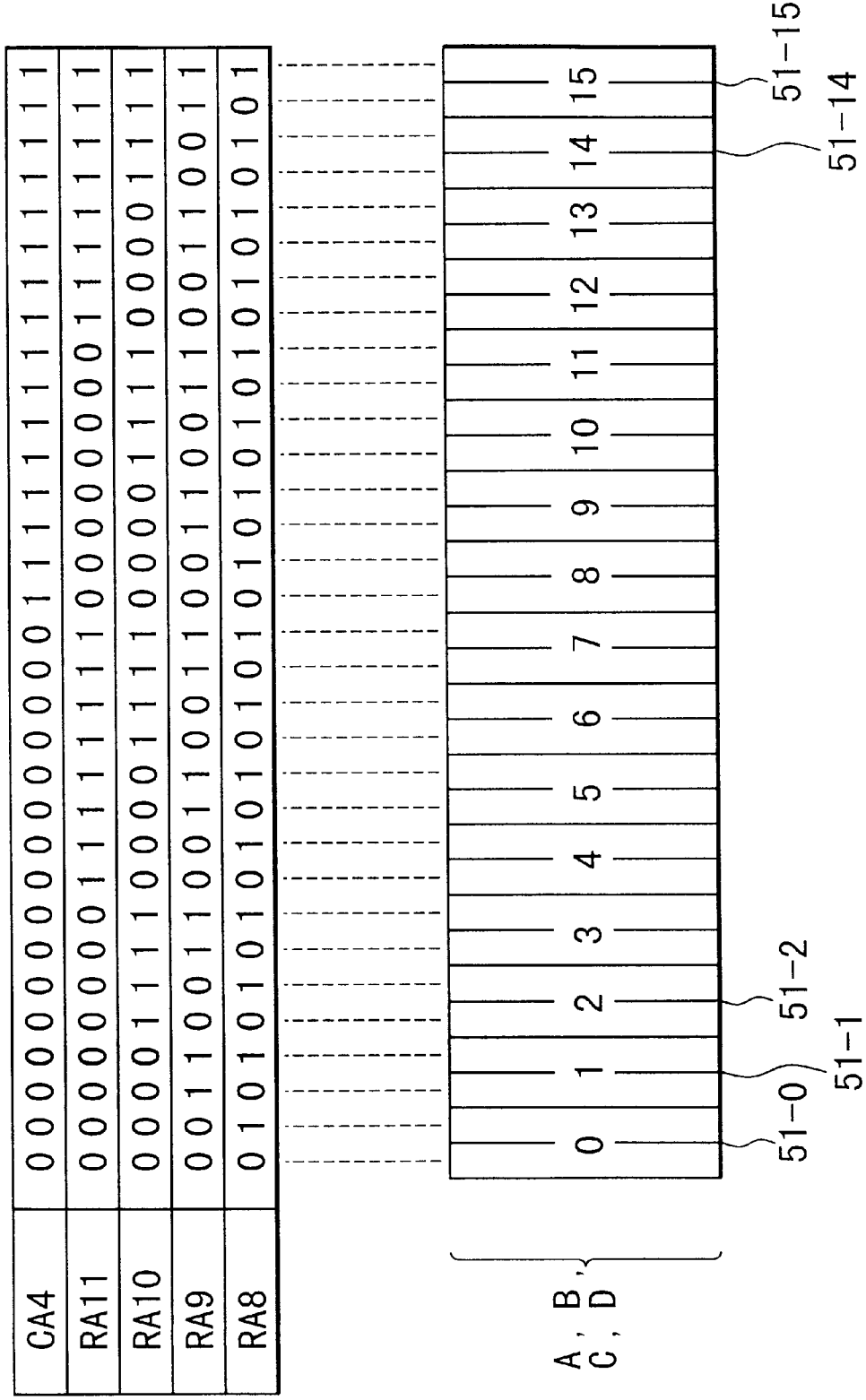
FIG. 26 is a representation showing a corresponding relation between a block address signal and a selected block in a sub-block column.
Figure 27:
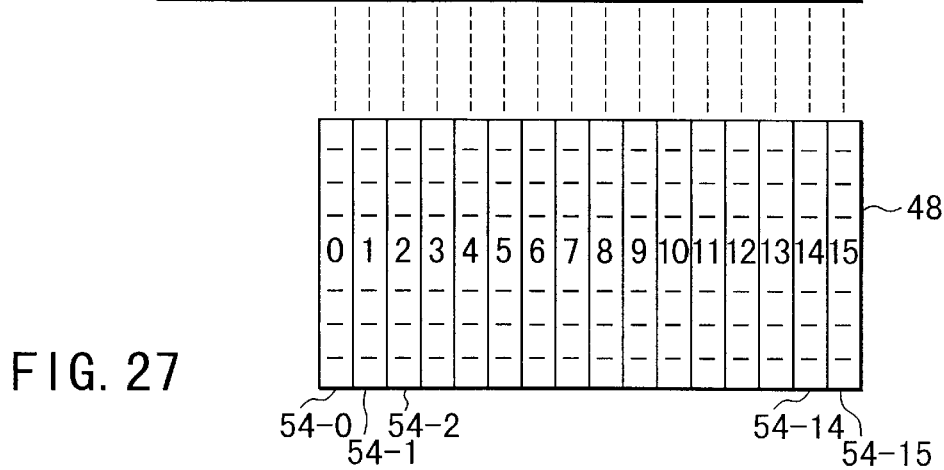
FIG. 27 is a representation showing a corresponding relation between a redundancy memory selection address signal and a selected block in a redundancy memory.

FIG. 26 shows a relation between block address signals CA4, RA11, . . . RA8 and a selected block 51-i of sub-block columns A, B, C, D. FIG. 27 shows a relation between redundancy memory address signals CA4, RA11, . . . RA9 and a selected block 54-i of a redundancy memory 48.

Blocks 51-i of the sub-block columns A, B, C, D and blocks 54-i of the redundancy memory 48 are in a condition of one to one correspondence and both are equal in number. In this example, the number of the sub-block columns A, B, C, D is set to 16 and therefore, the number of blocks of the redundancy memory 48 is set to 16.

Since the number of blocks 51-i and the number of blocks 54-i both are 16, that is the fourth power of 2, an address signal CA4, RA11, ... RA9 is used in order to select blocks. The address signal RA8 does not substantially contribute to the selection of a block.

Figure 28:
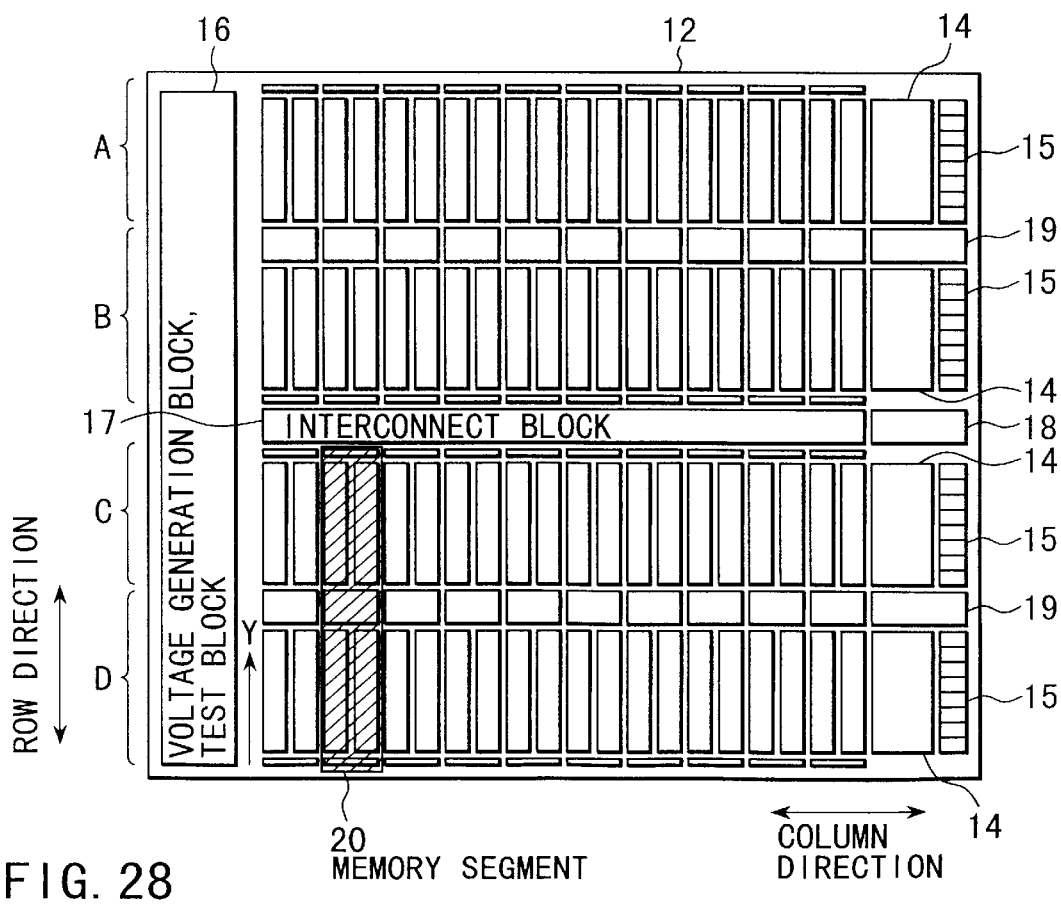
FIG. 28 is a representation of a floor plan in a memory macro.

FIG. 28 shows an example of a floor plan in the case where a memory capacity of the memory macro of FIG. 23 is decreased.

In this example, considered is the case where a memory capacity of the memory macro 12 is 20 megabits. In this case, the number of memory segments 20 is 20. A floor plan of the memory macro of this example is different from the floor plan of the memory macro with 32 megabits shown in FIG. 23 in that the numbers of the memory segments are different from each other when compared.

Figure 29:
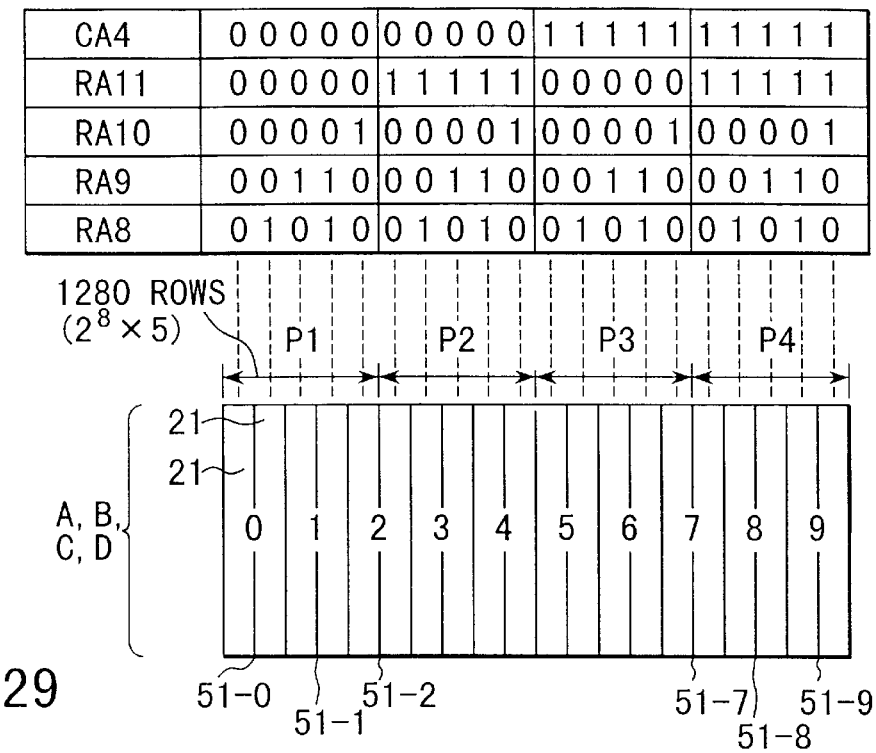
FIG. 29 is a representation showing a corresponding relation between a block address signal and a selected block in a sub-block column.
Figure 30:
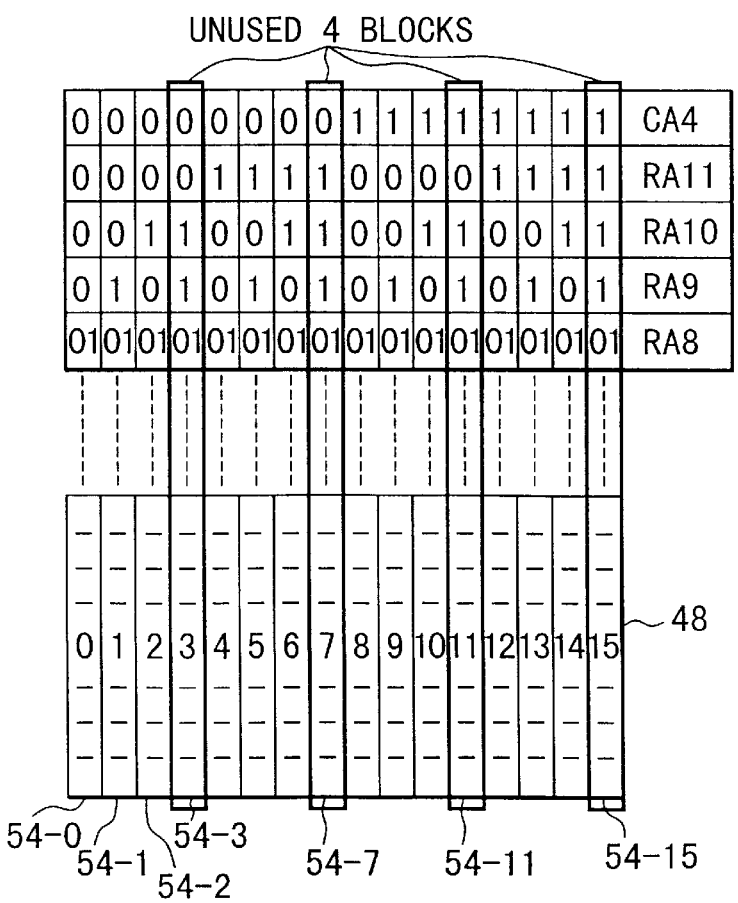
FIG. 30 is a representation showing a corresponding relation between a redundancy memory selection address signal and a selected block in a redundancy memory.

FIG. 29 shows a relation between block address signals CA4, RA11, ... RA8 and a selected block 51-i of sub-block columns A, B, C, D. FIG. 30 shows a relation between redundancy memory selection address signals CA4, RA11, ... RA9 and a selected block 54-i of a redundancy memory 48.

When the number of blocks of a sub-block column A, B, C, D is 10, a structure of a block decoder is different from the case where the number of blocks of a sub-block column A, B, C, D is 16. In this example, the number of blocks of a sub-block column A, B, C, D is 10 and the number cannot expressed in the form of the nth power of 2 ($2^n$). Therefore, the ten blocks 51-0, ... 51-9 are divided into four regions P1, ... P4 each of which is allocated by 2.5 blocks (5 sub-blocks 21 each).

In this case, one region has 1280 (512+512+256) rows. However, 1280 is expressed by ($2^8 \times 5$) but cannot be expressed in the form of the nth power of 2 ($2^n$). Accordingly the address signal CA4, RA11, ... RA8 which selects a block becomes discontinuous at boundaries among the four regions.

Blocks 51-2, 51-7 are divided into two parts by the boundaries P1, ... P4. Address assignment is performed so that the divided two parts can independently selected and block decoders are provided based on the assignment.

On the other hand, even when a memory capacity of a memory macro is changed, a memory capacity of a redundancy memory is not changed. For example, when the maximal number of blocks of a sub-block column in a memory macro is 16, the number of blocks of a redundancy memory is set to a constant value of 16. In this example, even when a memory capacity of the memory macro is changed, a structure of a redundancy memory decoder is not changed. That is, when a memory capacity of the memory macro is changed, a structure of a block decoder is required to be changed according to address assignment as shown in FIGS. 26 and 29, whereas a structure of a redundancy memory decoder is not required to be changed, since address assignment is not changed as shown in FIGS. 27 and 30.

Therefore, even when a memory capacity of a memory macro is changed, there arises no need for a great change in a design of a redundancy circuitry.

In this example, since block address signals CA4, RA11, ... RA8 are discontinuous, there are some of block address signals CA4, RA11, ... RAB which are not used for selection of blocks 51-i (both sides of sub-blocks comprising each of blocks of 51-2, 51-7) of sub-block columns A, B, C, D. For example, in four case where block address signals CA4, RA11, ... RA9 are "0011", "0111", "1011" and "1111", the block addresses signals sare not used for selection of a block of sub-block columns A, B, C, D.

Accordingly, there arise no use of four blocks 54-3, 54-7, 54-11 and 54-15 of a redundancy memory which are selected by redundancy memory selection address signals CA4, RA11, ... RA9 corresponding to the above block address signals.

Figure 31:
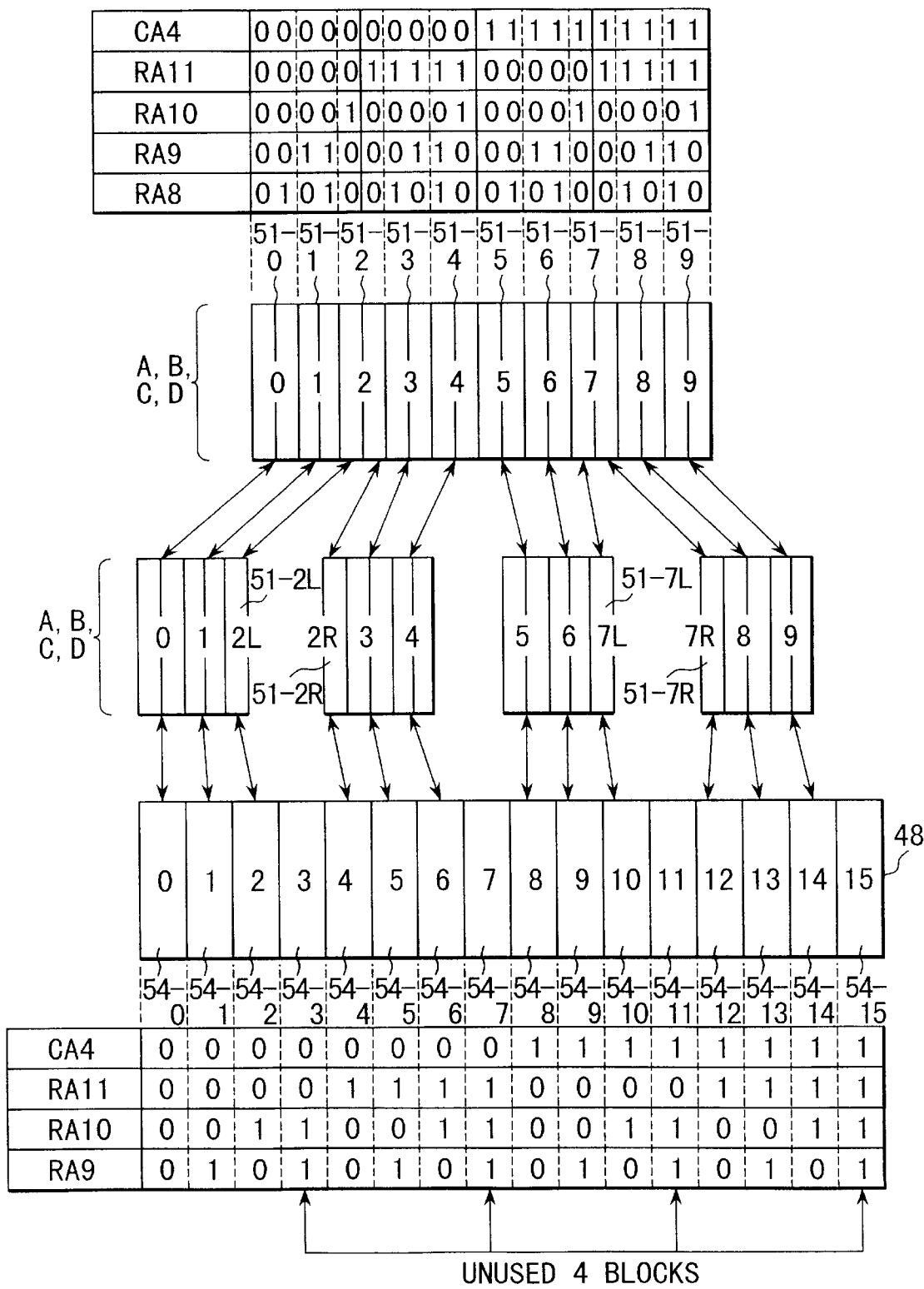
FIG. 31 is a representation showing a corresponding relation between a block in a sub-block column and a block in a redundancy memory.

FIG. 31 shows a corresponding relation between a block of a sub-block column A, B, C, D and a block of a redundancy memory.

The number of blocks of sub-block columns A, B, C, D is changed according to a memory capacity of a memory macro. In this example, the number of blocks 51-0, ... 51-9 of sub-block columns A, B, C, D is set to 10. In this case, block address signals CA4, RA11, ... RA8 are assigned to the blocks 51-0, ... 51-9 as shown in the figure.

For the blocks 51-2, 51-7, each is divided into two groups to form blocks 51-2L, 51-2R, 51-7L, 51-7R due to discontinuity of block address signals.

Therefore, sub-block columns A, B, C, D substantially includes 12 blocks 51-0, 51-1, 51-2L, 51-2R, 51-3, ..., 51-6, 51-7L, 51-7R, 51-8, 51-9.

On the other hand, the number of blocks of a redundancy memory is always constant regardless of a memory capacity of the memory macro. For example, when the maximal number of blocks of sub-block columns in the memory macro is 16, the number of blocks of a redundancy memory 48 is constantly set to 16. Accordingly, even when a memory capacity of the memory macro is changed, a structure of a redundancy memory decoder is not required to be changed, whereby a memory macro having an arbitrary memory capacity can be designed in a short time period.

Since sub-block columns A, B, C, D are substantially composed of 12 blocks, the number of blocks of a redundancy memory 48 which are actually used is required to be 12, which is sufficient for the purpose. Accordingly, four blocks 54-3, 54-7, 54-11, 54-15 of the 16 blocks of a redundancy memory 48 are not used for storage of data regarding a defective data line pair.

Figure 32:
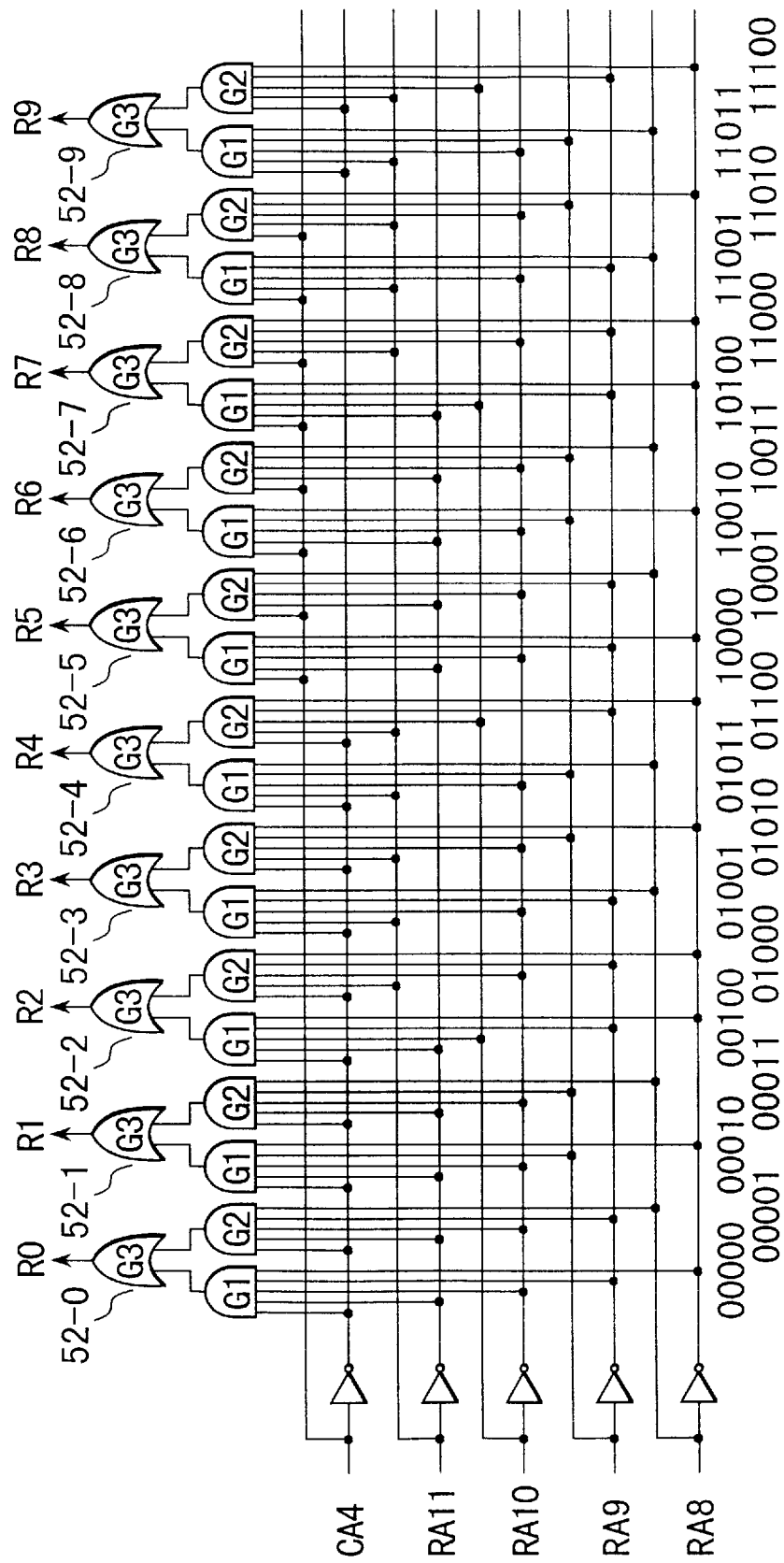
FIG. 32 is a circuit diagram showing an example of a block decoder.

FIG. 32 shows an example of a circuit structure of a block decoder when the memory macro of FIG. 28 and the address signal assignment of FIG. 29 are adopted.

Logic circuits 52-i (i=0, 1, ... 9) are provided in a corresponding manner to blocks in sub-block columns. In this example, since 10 blocks are included in one sub-block column, the number of logic circuits 52-i provided is 10. A logic circuit 52-i is composed of two AND circuits G1, G2 and an OR circuit G3 to which output signals of the two AND circuits are input. To the AND circuits G1, G2 of each logic circuit 52-i, input are block address signals CA4, RA11, ... RA8, which are different form each other.

One of output signals R0, ... R9 of the logic circuits 52-0, ... 52-9 assumes "1" and all the rest assume "0". For example, when a block address signal CA4, RA11, ... RA8 is "00000", an output signal of the AND circuit G1 of the logic circuit 52-0 assumes "1" and therefore, an output signal RO of the OR circuit G3 of the logic circuit 52-0 assumes "1". At this time, output signals R1, ... R9 of the logic circuits 52-1, ... 52-9 all assume "0". Accordingly, a block corresponding to the logic address 52-0 is selected.

When a block address signal CA4, RA11, ... RA8 are "00001", an output signal of the AND circuit G2 of the logic circuit 52-0 assumes "1". At this time, as well, an output signal R0 of the OR circuit G3 of the logic circuit 52-0 assume "1". When a row address signal RA12, ... RA8 is "00000" and "00001", output signals of the AND circuit G2 of the logic circuit 52-0 both assumes "1".

Figure 33:
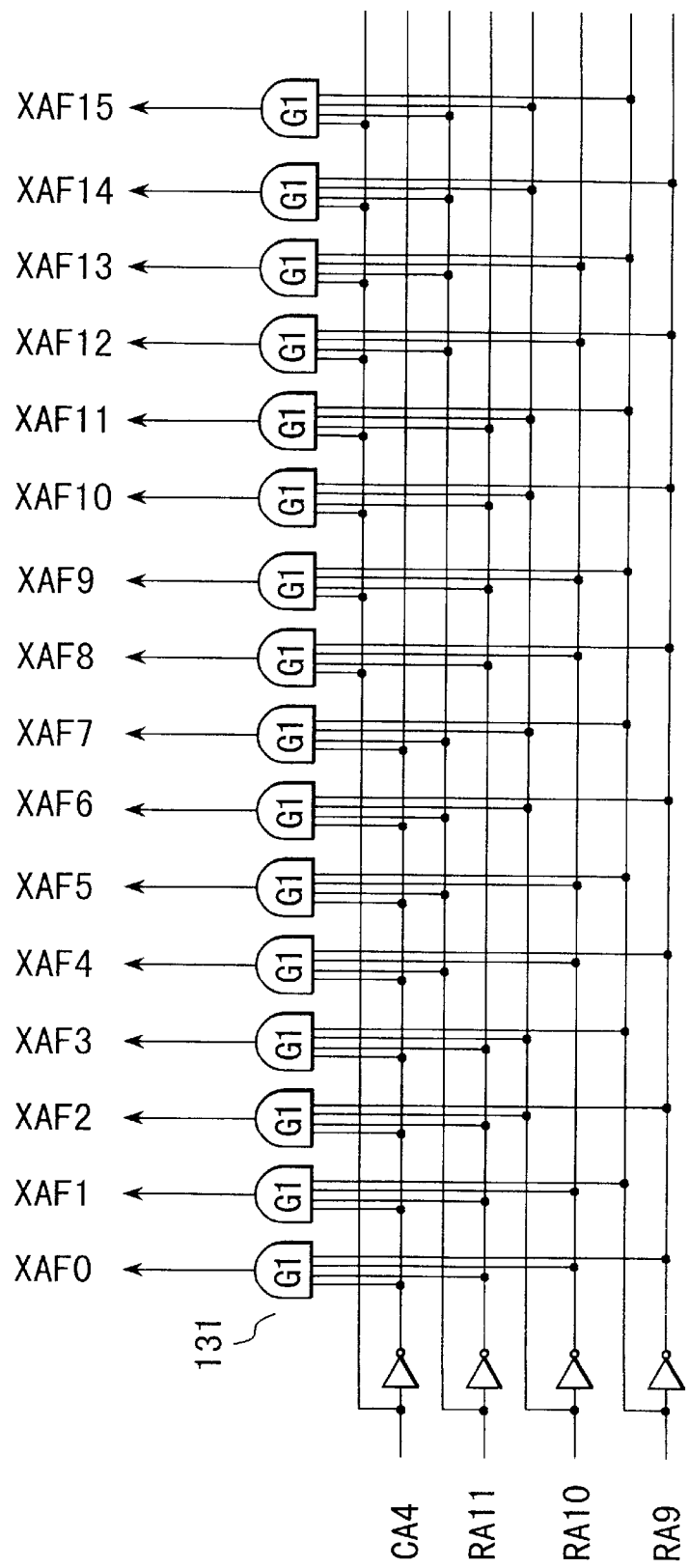
FIG. 33 is a circuit diagram showing an example of a redundancy memory decoder.

FIG. 33 shows an example of a circuit structure of a redundancy memory decoder in the case where the memory macro of FIG. 28 and the address signal assignment of FIG. 30 are adopted.

A structure of the redundancy memory decoder is absolutely same as that of the redundancy memory decoder of FIG. 25. That is, the cases where the number of blocks in the sub-block columns is 16 (for example, a memory capacity of 32 megabits) and where the number of blocks in the sub-block columns is 10 (for example, a memory capacity of 20 megabits) use the same redundancy memory decoders respectively.

The logic circuits 53-i (i=0, 1, . . . 9) are provided in a corresponding manner to a redundancy memory. The redundancy memory comprises 16 blocks and the number of blocks which are actually used is 12 as shown in FIG. 30 and 4 residual blocks 54-3, 54-7, 54-11, 54-15 are left unused.

A logic circuit 53-i is composed of an AND circuit Gl. To each logic circuit 53-i, there are input redundancy memory selection address signals (corresponding to block address signals) CA4, RA11, . . . RA9 which are different form one another.

One of output signals XAF0, . . . XAF9 of the logic circuits 53-0, . . . 53-9 assumes "1" and all the rest assume "0". For example, a redundancy memory address signal CA4, RA11, . . . RA9 are "0000", the output signal XAF0 of the redundancy circuit 53-0 assumes "1". When a redundancy memory address signal CA4, RA11, . . . RA9 is "0001", the output signal XAF 1 of the logic circuit 53-1 assumes "1".

In this example, the output signals XAF 3, 7, 11, 15 do not assume "1". Block address signals corresponding to redundancy memory address signals which make the output signals XAF 3, 7, 11, 15 to assume "1" are not used as shown in FIG. 31.

Figure 34A:
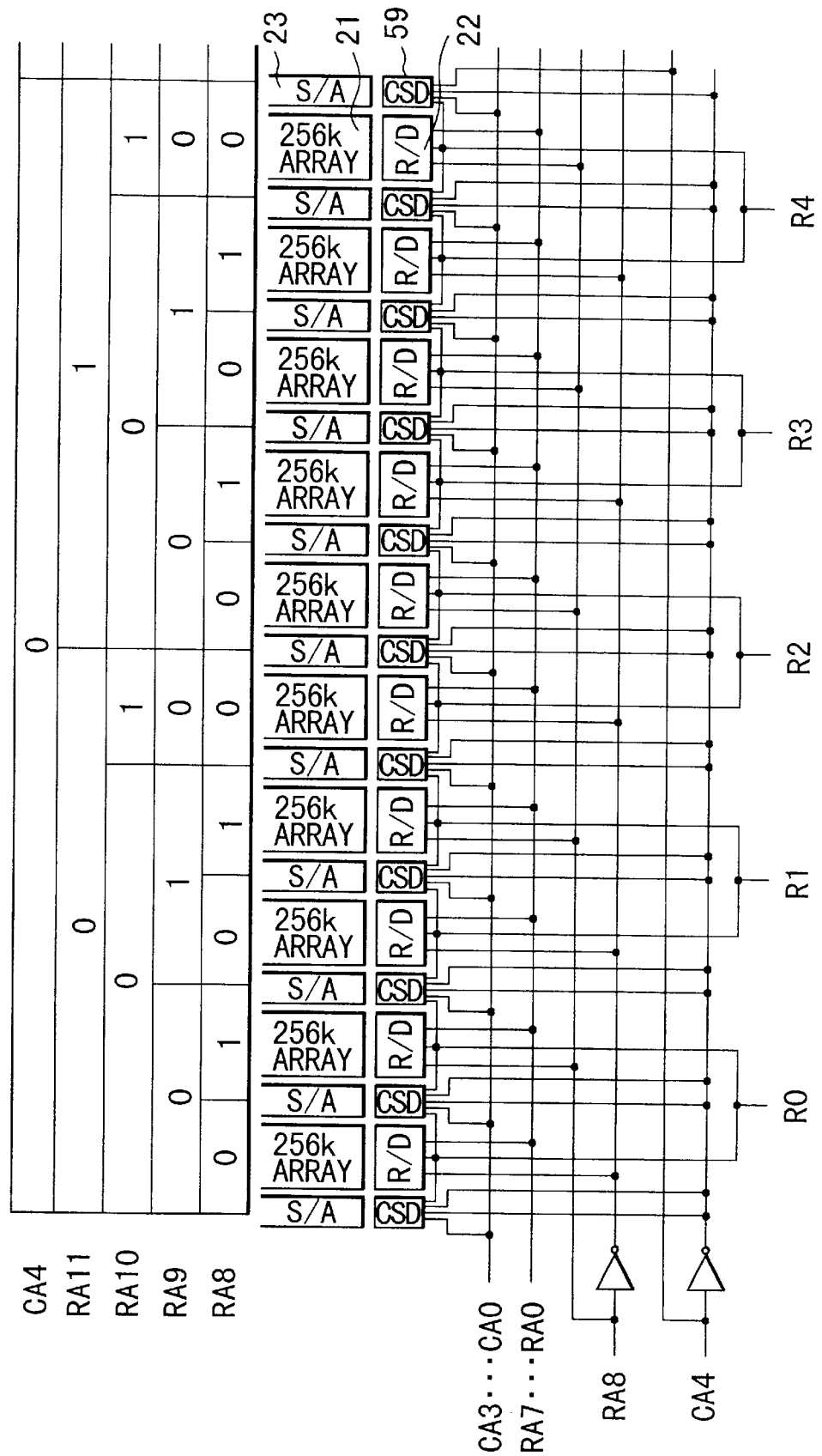
FIGS. 34A and 34B are representations showing address signals input to a row decoder and a column selection driver.
Figure 34B:
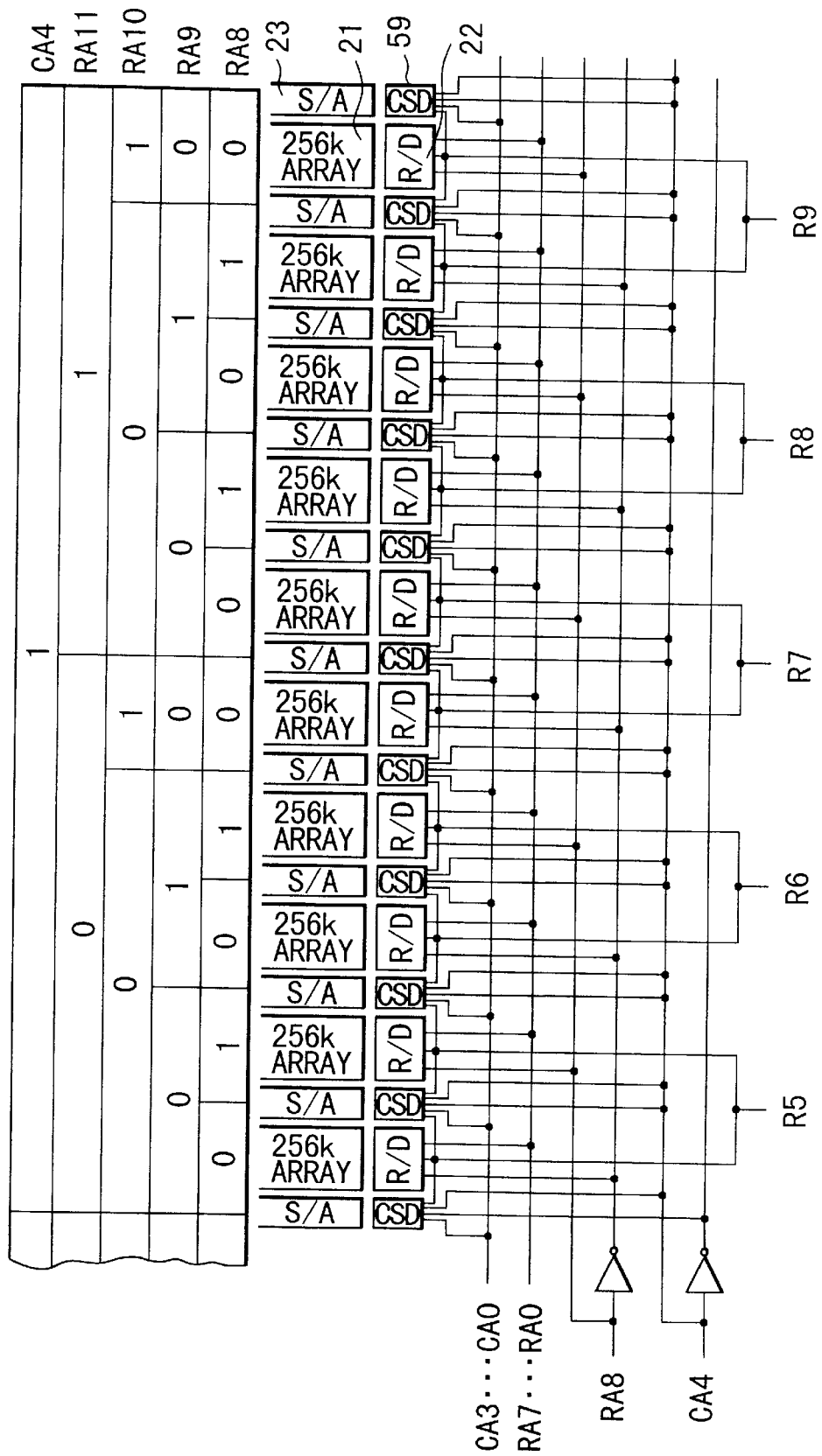

FIGS. 34A and 34B show address signals which are input to row decoders R/D and column selection drivers (column decoders) CSD.

R0, . . . R9 are the output signals of the block decoder of FIG. 32. Row addresses each of 8 bits RA7, . . . RA0 are input to row decoders 22. A row decoder 22 selects one of 256 word lines in a sub-block 21 based on a row address signal RA7, . . . RA0. A row address signal A8 is also input to a row decoder 22. A row decoder 22 selects one of two sub-blocks which abut on each other which are selected at the same time by a block decoder.

Column address signals each of four bits CA3, . . . CA0 are input to column selection drivers 59. A column selection driver 59 selects one of 16 bit line pairs BL, /BL based on a column address signal CA3, . . . CA0 (see FIGS. 5A and 5B). A column address signal CA4 is used for activation of a sense amplifier S/A.

As described above, when a memory capacity, that is the number of memory segments, of a memory macro is changed, there arises a necessity for performing a design change of a block decoder according to the number of memory segments (the number of blocks in sub-block columns). According to the present invention, however, a redundancy memory decoder is not required to be redesigned even when a memory capacity of a memory macro is changed. That is, a redundancy memory constantly has the number of blocks sufficiently covering a maximal memory capacity of a memory macro and some of blocks of the redundancy memory are out of use when a memory capacity of the memory macro is reduced.

Therefore, a semiconductor memory for which there is applied a designing method in which a memory capacity is changed by increase or decrease in the number of memory segments is not required to be redesigned on a redundancy circuitry even when a memory capacity is changed and hence reduction in a turn around time (TAT) and lower cost can be achieved.

The present invention can be applied in the case where the maximal number (the maximal memory capacity of the memory macro) of memory segments (or blocks in sub-block columns) is given and one memory segment (or one block in the sub-block columns), or the number of memory segments equal to or less than the maximal number is adopted. Especially, when the number of memory segments (blocks in sub-block columns) is not expressed in the form of the nth power of 2 ($2^n$), the present invention is effective. That is, in this case, if a structure of a redundancy memory decoder is to be changed, it takes a long time for redesigning due to its complexity, whereas according to the present invention, the redesigning is not necessary.

While the above examples is related to MERGED DRAM-LOGIC LSI, the present invention can also be applied to MERGED MEMORY-LOGIC LSIs such as MERGED FLASH MEMORY-LOGIC LSI, MERGED ferroelectric RAM-LOGIC LSI and the like.

Besides, the present invention can also be applied to LSIs comprising a semiconductor memory only such as DRAM, SRAM, FLASH MEMORY (NOR type EPROM, NAND type EEPROM) and the like. Moreover, the present invention can also applied to ASIC (application specific integrated circuit), system LSI comprising a functional block of a semiconductor memory, a microprocessor and the like. Besides, the present invention can also be applied to a function block as IP (Intellectual property).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory comprising:

a memory cell array composed of N ($1 \leq N \leq Nmax$) blocks;

a redundancy memory always composed of Nmax blocks;

a block decoder for selecting one of the N blocks of the memory cell array based on a block address signal;

a redundancy memory decoder for selecting one of the Nmax blocks of the redundancy memory based on a redundancy memory selection address signal including the block address signal; and a switching circuit which performs remedy of a defective cell in a block of the memory cell array selected by the block decoder based on data in a block of the redundancy memory selected by the redundancy memory decoder, wherein when the number of blocks of the memory cell array and the number of blocks of the redundancy memory are different from each other, the N blocks of the memory cell array are in a one to one correspondence with N blocks of the Nmax blocks of the redundancy memory a nd the redundancy memory decoder select s one of the N blocks of the redundancy memory.

2. A semiconductor memory according to claim 1, wherein when the number of blocks of the memory cell array and the number of blocks of the redundancy memory are different from each other, the redundancy memory decoder has the same structure as the block decoder.

3. A semiconductor memory according to claim 1, wherein when the number of blocks of the memory cell array and the number of blocks of the redundancy memory are different from each other, the redundancy memory decoder can select one of the Nmax blocks of the redundancy memory.

4. A semiconductor memory according to claim 1, wherein when the number Nmax of blocks of the redundancy memory is $2^n$ and the number N of blocks of the memory cell array is ($2^{n-1}$<N<$2^n$), the block address signal and the redundancy memory selection address signal are both of n bits, and each of the Nmax blocks of the redundancy memory is assigned with an address in a continuous manner and each of the N blocks of the memory cell array is assigned with an address in a discontinuous manner.

5. A semiconductor memory according to claim 1, wherein when the number Nmax of blocks of the redundancy memory is $2^n$ and the number N of blocks of the memory cell is $2^m$ (m<n), the block address signal is of m bits and the redundancy memory selection address signal is of n bits, and each of the Nmax blocks of the redundancy memory and each of the N blocks of the memory cell array are both assigned with an address in a continuous manner.

6. A semiconductor memory according to claim 1, wherein each block of the redundancy memory is constructed with a part in which there is stored data which indicates whether a defective cell is present and a part in which there is stored data which is used for replacement of the defective cell by a spare cell.

* * * * *